United States Patent
Eshel

(10) Patent No.: US 9,780,129 B2
(45) Date of Patent: Oct. 3, 2017

(54) SAMPLE-AND-HOLD CIRCUIT HAVING ERROR COMPENSATION CIRCUIT PORTION

(71) Applicant: Sony Semiconductor Solutions Corporation, Atsugi-Shi (JP)

(72) Inventor: Noam Eshel, Pardesia (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 180 days.

(21) Appl. No.: 14/877,158

(22) Filed: Oct. 7, 2015

(65) Prior Publication Data

US 2017/0104480 A1    Apr. 13, 2017

(51) Int. Cl.
    | | |
    |---|---|
    | *H03K 17/16* | (2006.01) |
    | *H01L 27/146* | (2006.01) |
    | *H03K 5/1252* | (2006.01) |
    | *G11C 27/02* | (2006.01) |

(52) U.S. Cl.
    CPC ...... *H01L 27/14609* (2013.01); *G11C 27/024* (2013.01); *G11C 27/026* (2013.01); *H03K 5/1252* (2013.01)

(58) Field of Classification Search
    CPC ............ H01L 27/14609; H03K 5/1252; H03K 17/16; G11C 27/024; G11C 27/026
    USPC ........................................ 250/208.1; 348/300
    See application file for complete search history.

(56) References Cited

U.S. PATENT DOCUMENTS

| | | | | |
|---|---|---|---|---|
| 6,072,355 A | * | 6/2000 | Bledsoe ............... | H03K 17/063 326/88 |
| 7,088,147 B2 | * | 8/2006 | Prasad .................. | G11C 27/024 327/91 |

\* cited by examiner

*Primary Examiner* — Seung C Sohn
(74) *Attorney, Agent, or Firm* — Michael Best & Friedrich LLP

(57) ABSTRACT

A sample-and-hold circuit having an error correction circuit portion that compensates for charge injection and noise. The error correction circuit portion includes an error-current-accumulating capacitor and a feedback circuit. The error-correction circuit performs error correction during a sampling operation by accumulating, at the error-current-accumulating capacitor, an error current output from an amplifier of the sample-and-hold circuit, and then applying, via the feedback circuit, a voltage boost to an input of the amplifier. The magnitude of the voltage boost depends on a voltage of the error-current-accumulating capacitor, and on various design parameters of the components of the circuit. By appropriately setting the design parameters, the magnitude of the fed-back voltage boost can be made to cancel out error due to charge injection and noise.

20 Claims, 14 Drawing Sheets

SAMPLE-AND-HOLD CIRCUIT HAVING ERROR COMPENSATION CIRCUIT PORTION

BACKGROUND

1. Field of the Invention

The present invention relates generally to an improved sample-and-hold circuit, and more particularly to reducing sampled noise or inaccuracies in the improved sample-and-hold circuit including therein a compensation circuit portion.

2. Description of the Related Art

In general, a sample-and-hold ("S/H") circuit samples a voltage value of a signal at a sampling time (the "sample" function), and then outputs a constant voltage corresponding to the sampled value for a period of time thereafter, regardless of whether the sampled signal has subsequently changed (the "hold" function). This is generally accomplished by, at a given sampling time, measuring the voltage of the signal in some way (for example, applying the signal to a capacitor), storing the measurement (for example, the capacitor stores the voltage of the signal applied to it), and then generating an output signal based on the stored measurement (for example, connecting the capacitor that stores the sampled voltage to an input of an amplifier).

For example, FIG. 1 shows the schematics of a S/H circuit 1, which may be referred to as a bottom plate sampling S/H circuit. The S/H circuit 1 comprises an amplifier 10, a sampling capacitor $C_{samp}$, and switches SW1, SW2 and SW3. $V_{ref}$ is a reference voltage, and $V_{in}$ is an input analog signal that is to be sampled. The operation of the S/H circuit 1 will be explained with reference to FIG. 2 through 5.

FIG. 2 shows the timing of the switches during the operation of the S/H circuit 1. In FIG. 2, a high state on any switch means that the switch is closed (i.e. connected), whereas a low state means that the switch is opened (i.e. disconnected). The voltage of the signal $V_{in}$ is sampled by the S/H circuit 1 during a sampling window comprising time periods t1' and t2', and then beginning in time period t3' the sampled voltage is output as $V_{out}$.

Although the theoretically ideal "sample" of a signal is a measure of the value of the signal at a discrete time, in actuality the sample will always be taken over a finite period of time, such as the above-mentioned sampling window spanning periods t1' and t2', since all realistic electronic components have finite response times. However, if the sampling period is brief relative to a rate of change of the input signal $V_{in}$, the input signal $V_{in}$ can be assumed to be constant during the sampling window, and the measured value can be assumed to be an instantaneous sample of the signal's voltage at any arbitrary time during the sampling window. Thus, in the example illustrated in FIGS. 2-5, the input signal $V_{in}$ is assumed to be constant during the sampling window, and the voltage of the input signal $V_{in}$ during the sampling window will be designated $V_{in\_t1'}$.

In a first time period t1', both switches SW1 and SW2 are closed, and SW3 is open. The state of the S/H circuit 1 in period t1' is shown in FIG. 3 with disconnected paths omitted. In the ideal case, in period t1' the inverting (negative) input of the amplifier 10 is charged to $V_{ref}$ by the feedback loop through switch SW1; this results in the sampling capacitor $C_{samp}$ being charged to a voltage of $V_{c\_t1'} = V_{in\_t1'} - V_{ref}$.

In time period t2, SW1 is opened, which disconnects the feedback path of the amplifier 10. The state of the S/H circuit 1 in time period t2' is shown in FIG. 4 with disconnected paths omitted. Since there is no path to charge towards the negative plate of the capacitor, the voltage of the sampling capacitor $C_{samp}$ during time period t2' remains at the level of the previous stage, i.e. $V_{in\_t1'} - V_{ref}$.

In time period t3', SW2 is opened and SW3 is closed, with SW1 remaining open. The state of the S/H circuit 1 in period t3' is shown in FIG. 5 with disconnected paths omitted. Assuming the input resistance and gain of the amplifier is infinite, the voltage $V_c$ on the sampling capacitor $C_{samp}$ and the feedback connection on the amplifier cause the output voltage of the amplifier to be the same as $V_{in}$. That is:

$$V_{out} - V_c V_{ref} = (V_{in\_t1'} - V_{ref}) V_{ref} = V_{in\_t1'}.$$

Thus, as a result of the operations described above, the S/H circuit 1 measures (samples) the voltage of the input signal $V_{in}$ at a sampling timing (i.e., the voltage $V_{in\_t1'}$) and thereafter outputs a constant signal $V_{out}$ corresponding to the measured voltage, i.e. $V_{out} = V_{in\_t1'}$.

SUMMARY

The foregoing discussion of the operation of the S/H circuit 1 assumed ideal conditions, i.e., where the resistance of any switch is zero when it is closed, the stray capacitance of any switch is zero when it is opened, the input resistance of the differential amplifier is infinite, the output resistance of the differential amplifier is zero, the open loop gain of the differential amplifier is infinite, noise is not present in the circuit, etc. In actual circuit implementations, these ideal conditions are not true and the actual conditions cause deviation in the voltages. As a result, the output voltage $V_{out}$ of the S/H circuit 1 is not exactly the same as the input voltage $V_{in}$, but deviates by some amount depending on the circuit conditions and operating speed.

Two primary reasons, among others, that cause the deviation between the output voltage $V_{out}$ and the input voltage $V_{in}$ are charge injection and noise in the circuit.

Charge injection refers to the phenomenon in which some of the charge held in the sampling capacitor $C_{samp}$ flows to stray (parasitic) capacitances of the circuit elements, in particular the switches. Consider the case in which the switches SW1, SW2 and SW3 are implemented using Metal Oxide Semiconductor (MOS) transistors (a control signal to the gate of each MOS transistor controls the on-off state of the switch). By the nature of the MOS based switch circuit, there are capacitances between the gate and source nodes, and between the gate and drain nodes. For example, FIG. 6 shows the S/H circuit 1 during the time period t3 with a MOS transistor for switch SW1. FIG. 6 also illustrates the stray (parasitic) capacitance $C_{gs}$ from the gate of the SW1 MOS transistor to the source node, and the stray capacitance $C_{gd}$ from the gate to the drain node. The two stray capacitances $C_{gs}$ and $C_{gd}$ combined can be thought of as being in a parallel path with $C_{samp}$, which connects the inverting (negative) input terminal of the differential amplifier 10 to the output of the amplifier 10. As a result, some quantity of charges will flow from $C_{samp}$ to $C_{gs}$, with the amount of charge depending on the values of the capacitances $C_{gd}$, $C_{gs}$, and $C_{samp}$, the voltage $V_{ref}$, the switch's on/off voltages $V_{on}$ and $V_{off}$, and the fall time $T_{fall}$ of $V_{on}$. This charge sharing action will still change the voltage across $C_{samp}$ from the value specified by the ideal scenario. Although the stray capacitances may be small compared to $C_{samp}$ (and hence the change in voltage is small), this charge sharing action will still cause a non-zero change in the voltage across $C_{samp}$, which means that $V_{out}$ is no longer exactly the same as $V_{in}$. This inaccuracy in $V_{out}$ is referred to as a charge injection noise and it is time invariant in nature. The charge injection noise can be written as follows:

$$\Delta V_{cinj} = (V_{out} - V_{in})|_{C_{gs}=0; C_{gs}=0} = \alpha(C_{gs}, C_{gd}, C_{samp}, T_{fall}, V_{ref}, V_{on}, V_{off})$$ (eq. 1)

Another source of inaccuracy in the output of the S/H circuit 1 is due to noise in the circuit. FIG. 7 shows the S/H circuit 1 of FIG. 1 but with additional resistances drawn in series or in parallel with selected circuit components to indicate the impact of noise on the S/H circuit 1. In other words, the resistances represent equivalent thermal (Johnson) noise sources as well as other noises in the various circuit components. Specifically, the following noise sources are highlighted in FIG. 7: (1) if the input voltage source $V_{in}$ (e.g. from a pixel in an image sensor) is not ideal and has a non-zero output resistance, the output resistance will cause thermal noise to be added to $V_{in}$; (2) if the output of the amplifier has physical devices inside (transistors and resistors), it contributes noise to $V_{out}$; (3) the nature of the MOS circuit in the switches SW1, SW2, and SW3 adds noise to the circuit path; (4) noise from the power supply $V_{DD}$ of the amplifier 10 may leak into the input/output paths of the differential amplifier 10 since the power supply rejection ratio of the amplifier is not infinite. The noise sources included in FIG. 7 are time varying in nature. Overall the various noise sources contribute KTC noise ("$N_{KTC}$"), 1/f noise ("$N_{1/f}$") and power supply noise ("$N_{VDD}$") to the S/H circuit 1. The inaccuracies due to noise can be written as $$\Delta V_{noise} = (V_{out} - V_{in})|_{noise=0} = \gamma(N_{KTC}, N_{1/f}, N_{VDD})$$ (eq. 2)

Since the noise $\gamma$ is time varying, the bandwidth of the amplifier is tuned usually to be not more than the minimum required for meeting the time budget of the system. At the instant of the sampling, the charge kept on $C_{samp}$ will freeze the momentary noise level $\gamma$ at the sampling time.

Jointly, the time invariant charge injection noise $\alpha$ and the time varying noise $\gamma$ contribute to inaccuracies in the S/H circuit 1. We can think of the overall impact of the inaccuracies to be represented by an error voltage $\Delta V_{error}$ across the two terminals of the differential amplifier 10, where $$\Delta V_{error} = \Delta V_{cinj} + \Delta V_{noise} = \alpha + \gamma$$ (eq. 3)

This error means that the output of the S/H circuit 1 is different from the sampled voltage, which degrades the performance of any device in which the S/H circuit 1 is included. For example, if the S/H circuit 1 is supposed to sample a pixel output signal of a pixel of an image sensor, the error $\Delta V_{error}$ results in an inaccurate value being stored as a pixel value in an image. When multiple S/H circuits 1 are included in the image sensor the problem is compounded, and pattern noise may appear in the image.

Therefore, there is a need to improve on the accuracy of S/H circuits. The present disclosure solves these and other problems by providing improved S/H circuits, methods, and devices. According to one exemplary illustration, a semiconductor device may comprise a sample-and-hold circuit and an error correction circuit comprising an error-current-accumulating capacitor and a feedback circuit. The error correction circuit may be configured to perform an error correction operation comprising accumulating, at the error-current-accumulating capacitor, an error current output from an amplifier of the sample-and-hold circuit, and applying, via the feedback circuit, a voltage boost to an input of the amplifier, where the magnitude of the voltage boost depends on a voltage of the error-current-accumulating capacitor.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

In the following description, for purposes of explanation, numerous details are set forth, such as circuit configurations, waveform timings, circuit operations, etc., in order to provide an understanding of one or more embodiments of the present invention. However, it is and will be apparent to one skilled in the art that these specific details are not required in order to practice the present invention.

The present disclosure is related to improved S/H circuits with error correction capabilities, as well as devices and methods for calibrating such S/H circuits. The following discussion focuses mainly on examples in which the S/H circuits are used in image sensors, but it will be understood that this is merely one example. It will be understood that the disclosed S/H circuits can be used in any device in which there is a need to sample a signal.

Figure 9:
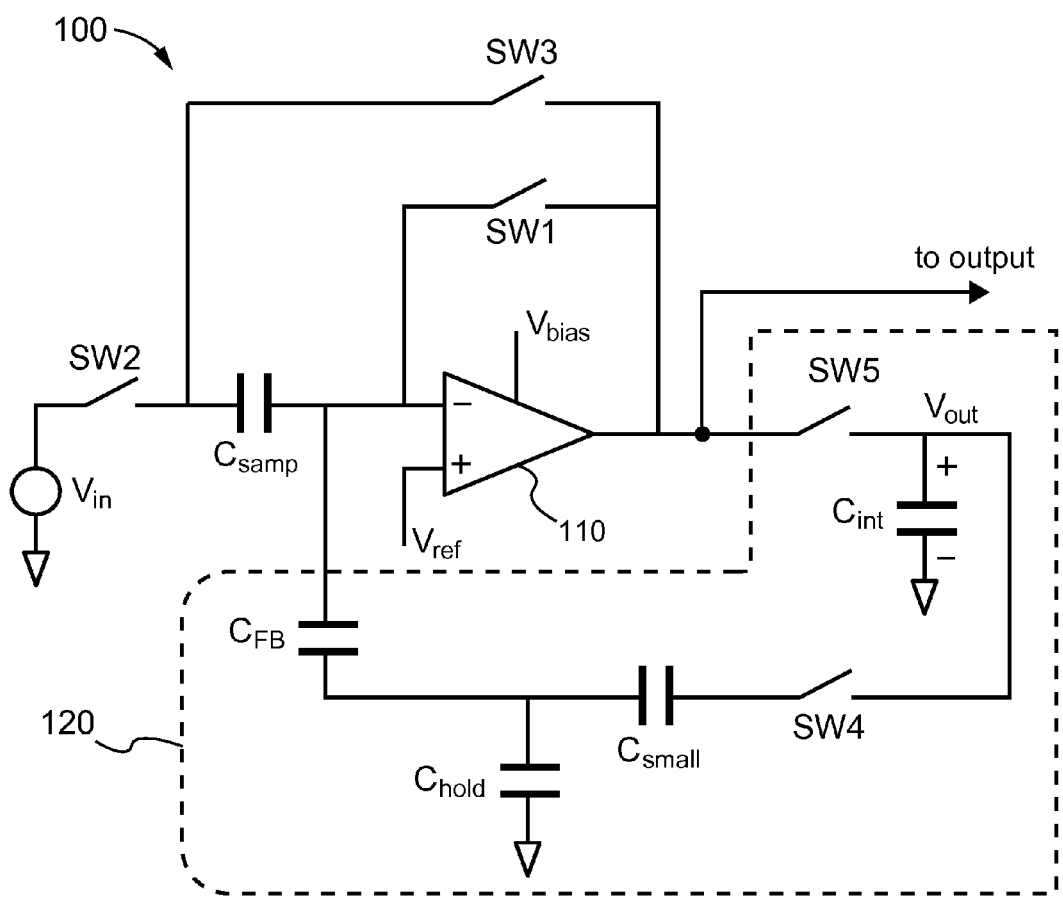
FIG. 9 is a circuit diagram illustrating a sample and hold circuit 100 with an error correction portion 120.

FIG. 9 illustrates a S/H circuit 100 that includes an error correction circuit 120 portion that can correct for the error $\Delta V_{error}$ (see equations 1-3 above). The S/H circuit 100 includes an amplifier 110, a sampling capacitor $C_{samp}$, switches SW1, SW2, SW3, SW4, and SW5, an output node, an output integration capacitor $C_{int}$, and feed-back loop capacitors $C_{small}$, $C_{hold}$, and $C_{FB}$. The switches SW4 and SW5 and the capacitors $C_{int}$, $C_{small}$, $C_{hold}$, and $C_{FB}$ form an error correction circuit 120 portion of the S/H circuit 100. The operation of the S/H circuit 100 differs from the operation of the S/H circuit 1, as a result of the addition of an error correction operation associated with the error correction circuit 120 portion. By way of the aforementioned error correction operation, the error correction circuit 120 portion of the S/H circuit 100 can minimize and even eliminate $\Delta V_{error}$, such that the output voltage $V_{out}$ of the S/H circuit 100 approaches the sampled voltage of the input signal $V_{in}$.

Figure 10:
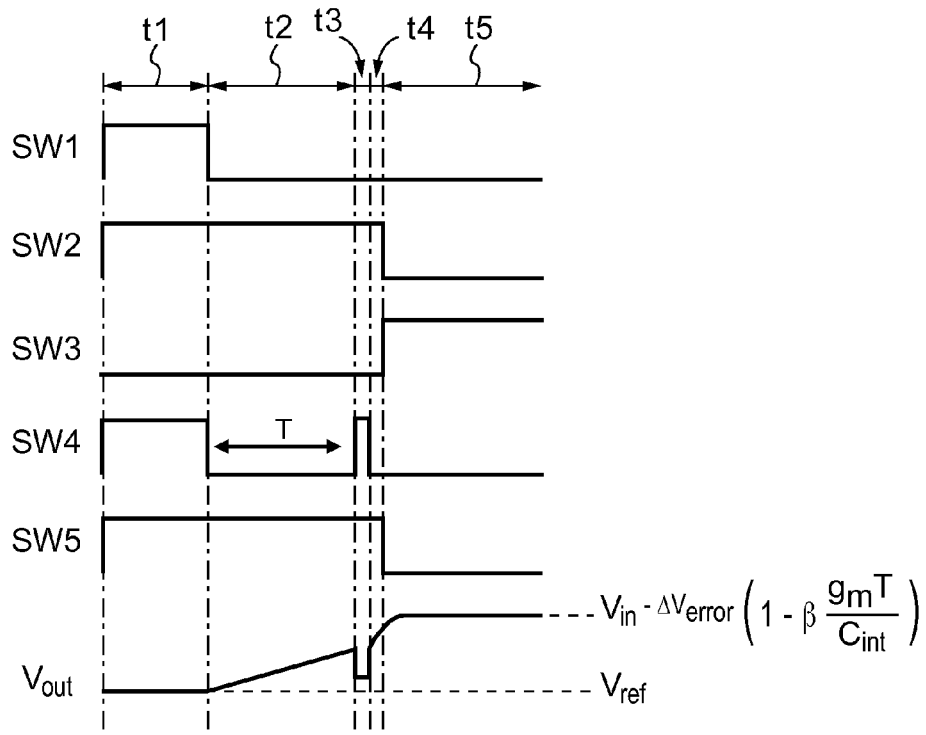
FIG. 10 is a timing diagram illustrating operations of the sample and hold circuit 100.

The operation of the S/H circuit 100 will be described with reference to FIGS. 10 through 15. FIG. 10 shows the timing signals of the switches SW1, SW2, SW3, SW4, and SW5 (high signals indicate closed (i.e., connected) switches), as well as the output voltage $V_{out}$ at the integration capacitor $C_{int}$. FIGS. 11 through 15 illustrate the S/H circuit 100 during time periods t1 through t5, with disconnected paths omitted. Similar to the discussion above of the S/H circuit 1, it will be assumed that the input signal $V_{in}$ is constant during a sampling window (which begins at time period t1), and therefore the voltage of the input signal $V_{in}$ during the sampling window will be designated $V_{in\_t1}$.

Figure 11:
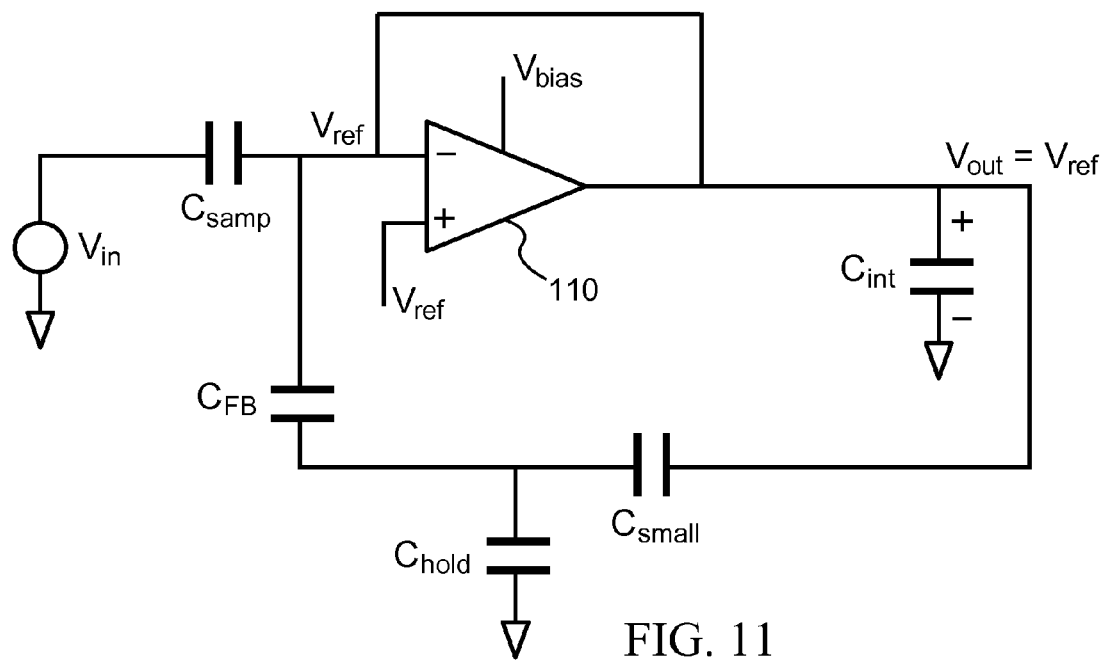
FIG. 11 is a circuit diagram illustrating a state of the sample and hold circuit 100 during time period t1.

In time period t1, switches SW1, SW2, SW4 and SW5 are closed, whereas SW3 is opened. The state of the circuit 100 in time period t1 is shown in FIG. 11. In the ideal case, in period t1 the inverting (negative) input of the amplifier 110 is charged to $V_{ref}$ by the feedback loop through switch SW1; this results in the sampling capacitor $C_{samp}$ being charged to a voltage of $V_{c\_t1}=V_{in\_t1}-V_{ref}$. Hence the voltage of the output signal $V_{out}$ during time period t1 equals $V_{ref}$. At this stage, charge injection has not happened yet.

Figure 12:
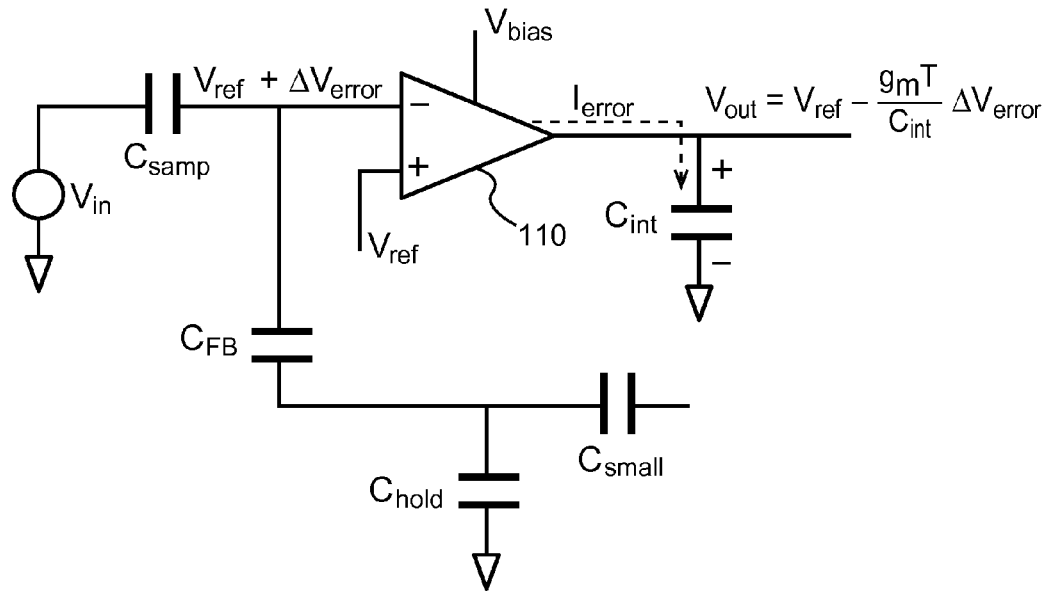
FIG. 12 is a circuit diagram illustrating a state of the sample and hold circuit 100 during time period t2.

In time period t2, switches SW1 and SW4 are opened, whereas switches SW2 and SW5 remain closed, and SW3 remains opened. The state of the circuit 100 in time period t2 is shown in FIG. 12. The opening of switch SW1 is one significant source of charge injection. Thus, at this stage, the combined effects of charge injection ($\alpha$) and noise ($\gamma$) modifies the differential voltage at the input of the differential amplifier 110. Although it is the differential voltage of the amplifier 110's inputs that is modified, for simplicity the noise $\Delta V_{error}$ will be represented herein as an increase in the voltage of the inverting (negative) input of the amplifier 110, with the non-inverting input staying at $V_{ref}$. Thus, the inverting input of the amplifier 110 has a voltage of $V_{ref}+\Delta V_{error}$, which means that the voltage of the sampling capacitor $C_{samp}$ becomes $V_{in\_t1}-(V_{ref}+\Delta V_{error})$ (contrary to the idealized assumption that the voltage of the sampling capacitor $C_{samp}$ remains at the level of the previous stage). If this error is not corrected, then ultimately the output voltage $V_{out}$ will differ from the input voltage $V_{in\_t1}$ by $\Delta V_{error}$.

The error $\Delta V_{error}$ is corrected by the error correction circuit 120 portion of the S/H circuit 100 by feeding back to the inverting (negative) input of the amplifier 110 an amount of charge that is calculated so as to cancel out the voltage $\Delta V_{error}$. The process of feeding back the charge to the inverting (negative) input of the amplifier 110 begins in time period t2. During time period t2, an error current $I_{error}$ is generated, since the differential voltage of the amplifier 110 is non-zero (i.e., $\Delta V_{error}$). The error current $I_{error}$ causes the output integration capacitor $C_{int}$ to charge up from its previous value ($V_{ref}$). This stage continues for a period of time T as shown in FIG. 10. The magnitude of the error current $I_{error}$ can be calculated using the transconductance $g_m$ of the differential amplifier 110 with the following equation:

$$I_{error}=g_m\Delta V_{error} \quad \text{(eq. 4)}$$

Figure 1:
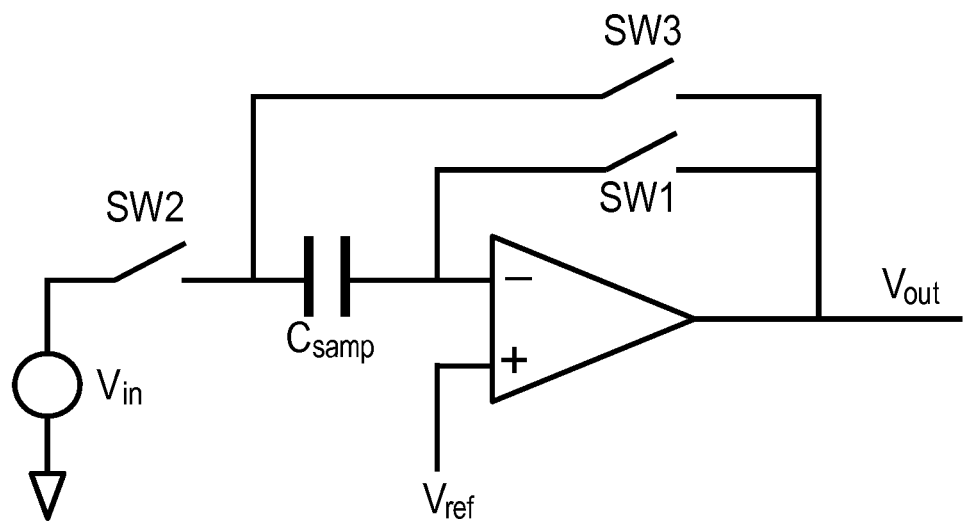
FIG. 1 is a circuit diagram illustrating a sample and hold circuit 1.
Figure 2:
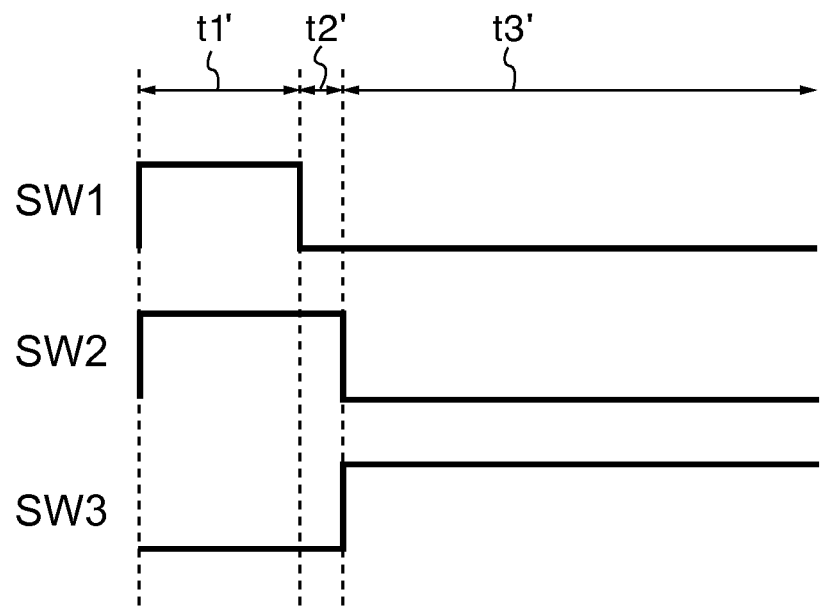
FIG. 2 is a timing diagram illustrating operations of the sample and hold circuit 1.
Figure 3:
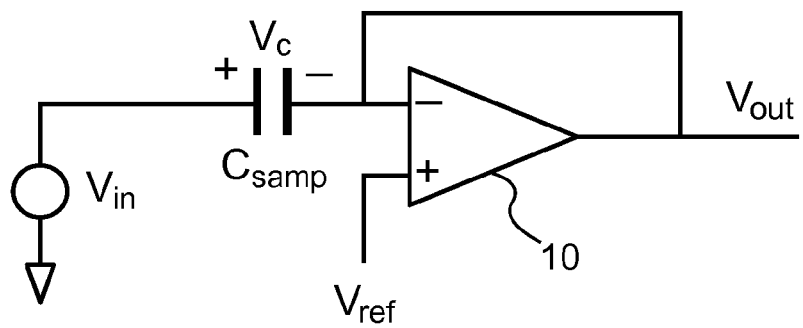
FIG. 3 is a circuit diagram illustrating a state of the sample and hold circuit 1 during time period t1'.
Figure 4:
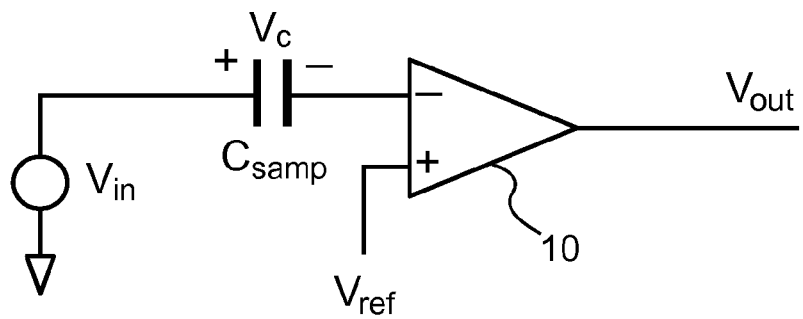
FIG. 4 is a circuit diagram illustrating a state of the sample and hold circuit 1 during time period t2'.
Figure 5:
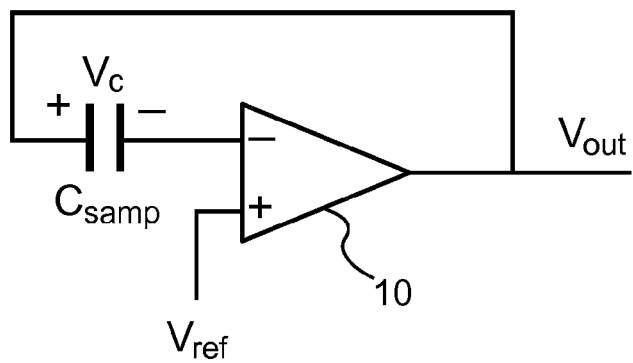
FIG. 5 is a circuit diagram illustrating a state of the sample and hold circuit 1 during time period t3'.
Figure 6:
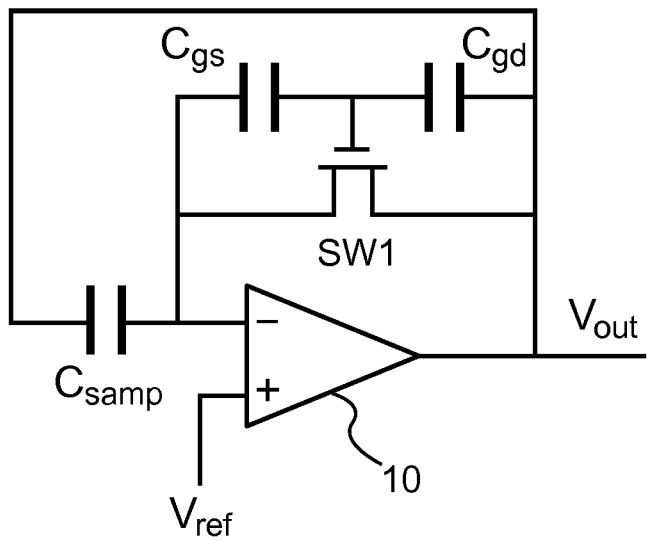
FIG. 6 is a conceptual diagram illustrating parasitic capacitances in the sample and hold circuit 1.
Figure 7:
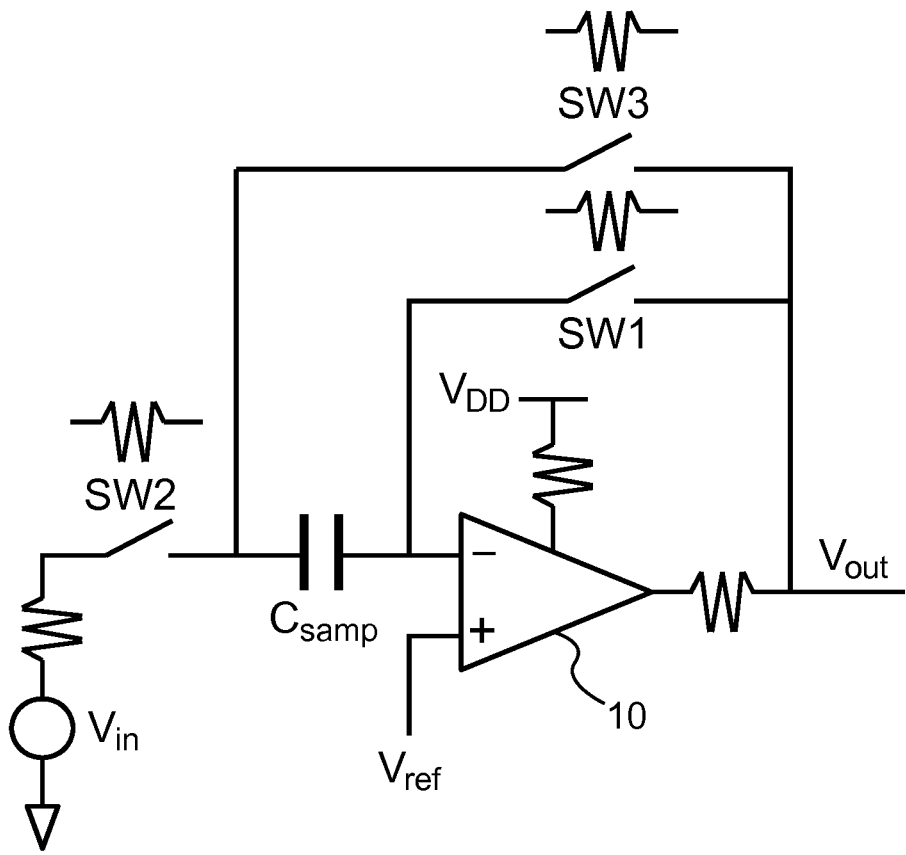
FIG. 7 is a conceptual diagram illustrating noise sources in the sample and hold circuit 1.
Figure 8:
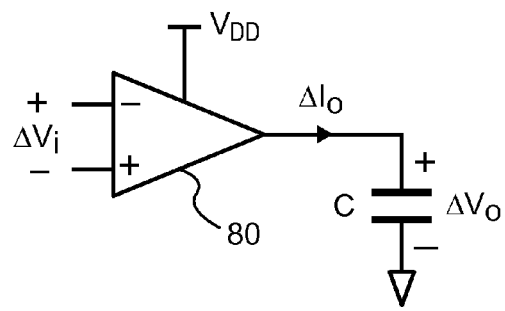
FIG. 8 is a circuit diagram illustrating an amplifier 80.

The transconductance $g_m$ is a property of any differential amplifier, including the differential amplifier 110, and will be explained with reference to a generic differential amplifier 80 shown in FIG. 8. The output of the differential amplifier 80 is connected to a capacitive load C. The voltage between the two input terminals is denoted by $\Delta V_i$. Note that $\Delta V_i$ is defined with an opposite polarity to the natural polarities of the two input terminals of the differential amplifier 80. In other words, the positive and negative ends of $\Delta V_i$ are connected to the negative and positive input terminals, respectively, of the differential amplifier 80. Let the output current of the differential amplifier be $\Delta I_o$. The input-output characteristics of the differential amplifier 80 can be described by the transconductance $g_m$, which is the ratio of the output current $\Delta I_o$ to the differential input voltage $\Delta V_i$ of the differential amplifier 80, i.e.:

$$g_m=-\frac{\Delta I_o}{\Delta V_i} \quad \text{(eq. 5)}$$

The minus sign in the definition of $g_m$ accounts for the fact that the polarity of $\Delta V_i$ is opposite to the polarities of the two input terminals. Substituting $I_{error}$ for $\Delta I_o$ and $\Delta V_{error}$ for $\Delta V_i$ in equation 5 yields equation 4. The amount that the voltage $V_{out}$ of the capacitor $C_{int}$ increases during the time T as a result of the charging current $I_{error}$ can be determined using the general relationship between a capacitor's voltage and a charging current, which yields:

$$\Delta V_{out}=\frac{I_{error}T}{C_{int}} \quad \text{(eq. 6)}$$

Thus, by combining equations 4 and 6, and noting that the initial voltage $V_{out}$ of the capacitor $C_{int}$ at the start of time period t2 was equal to $V_{ref}$, it can be seen that at the end of time period t2, the voltage $V_{out}$ at the capacitor $C_{int}$ will be:

$$V_{out}=V_{ref}+\Delta V_{out}=V_{ref}-\frac{g_mT}{C_{int}}\Delta V_{error} \quad \text{(eq. 7)}$$

Figure 13:
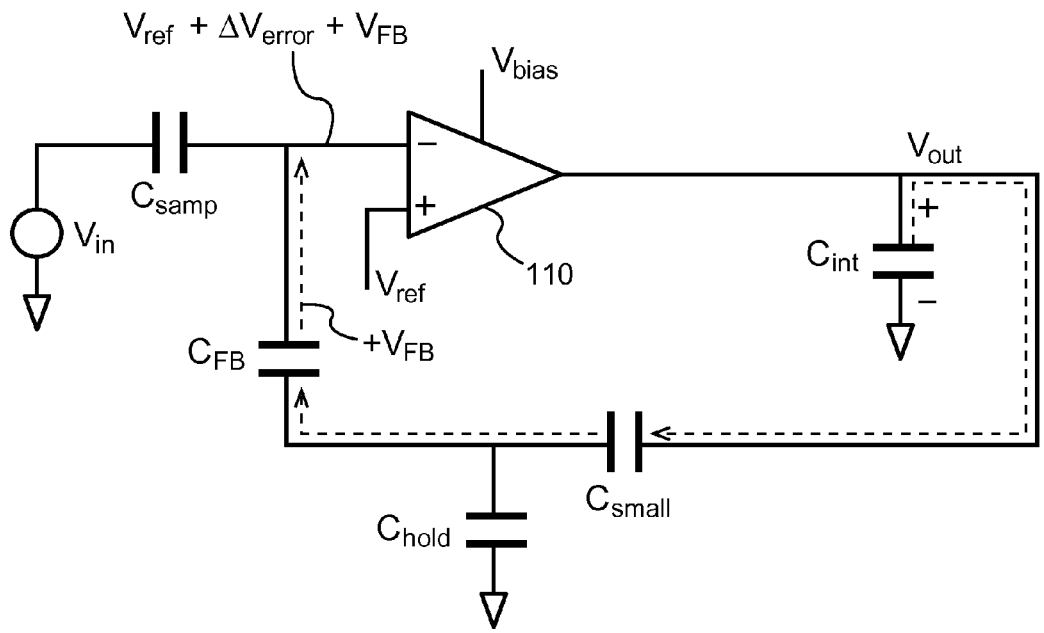
FIG. 13 is a circuit diagram illustrating a state of the sample and hold circuit 100 during time period t3.

In the time period t3, switch SW4 is closed for a short moment while the other switches remain unchanged (i.e., SW1 and SW3 remain opened, whereas SW2 and SW5 remain closed). The state of the circuit in time period t3 is shown in FIG. 13. This short (in time) stage briefly connects $C_{small}$ and $C_{int}$ so that the integration level $V_{out}$ is sampled by the feed-back loop capacitors $C_{small}$, $C_{hold}$, and $C_{FB}$ (i.e., a portion of the charge in $C_{int}$ flows to $C_{small}$). This results in adding a feedback voltage $\Delta V_{FB}$ to the inverting (negative) input of the amplifier 110 (i.e., some charge is injected to the inverting (negative) input of the amplifier 110). The voltage $\Delta V_{FB}$ that is added to the inverting input is given by:

$$\Delta V_{FB}=\beta\Delta V_{out}=-\beta\frac{g_mT}{C_{int}}\Delta V_{error} \quad \text{(eq. 8)}$$

where $\beta$ is a parameter representing the voltage gain from the input of $C_{small}$ to the inverting (negative) input of the amplifier 110. The parameter $\beta$ depends on the capacitance values of the capacitors $C_{small}$, $C_{hold}$, $C_{samp}$, and $C_{FB}$. Recalling that the voltage of the inverting (negative) input of the amplifier 110 was $V_{ref}+\Delta V_{error}$ prior to the feeding back of $\Delta V_{FB}$, the voltage of the inverting (negative) input of the amplifier 110 after the feeding back of $\Delta V_{FB}$ becomes:

$$V_{ref} + \Delta V_{error} + \Delta V_{FB} = \quad \text{(eq. 9)}$$
$$V_{ref} + \Delta V_{error} - \beta \frac{g_m T}{C_{int}} \Delta V_{error} = V_{ref} + \Delta V_{error}\left(1 - \beta \frac{g_m T}{C_{int}}\right)$$

As can be seen from equation 9, if the design parameters of the error correction circuit 120 are appropriately chosen, it is possible to cause the feedback voltage $\Delta V_{FB}$ to cancel out $\Delta V_{error}$, thus diminishing and potentially even eliminating the effects of the error $\Delta V_{error}$. In particular, if the design parameters are chosen such that $$\beta \frac{g_m T}{C_{int}} = 1,$$

then the error term of equation 9, namely the term $$\Delta V_{error}\left(1 - \beta \frac{g_m T}{C_{int}}\right),$$

will become zero. This means that the feedback voltage $\Delta V_{FB}$ completely cancels out the error $\Delta V_{error}$, and the differential voltage of the amplifier 110 becomes zero immediately prior to the closing of the switch SW3.

Figure 14:
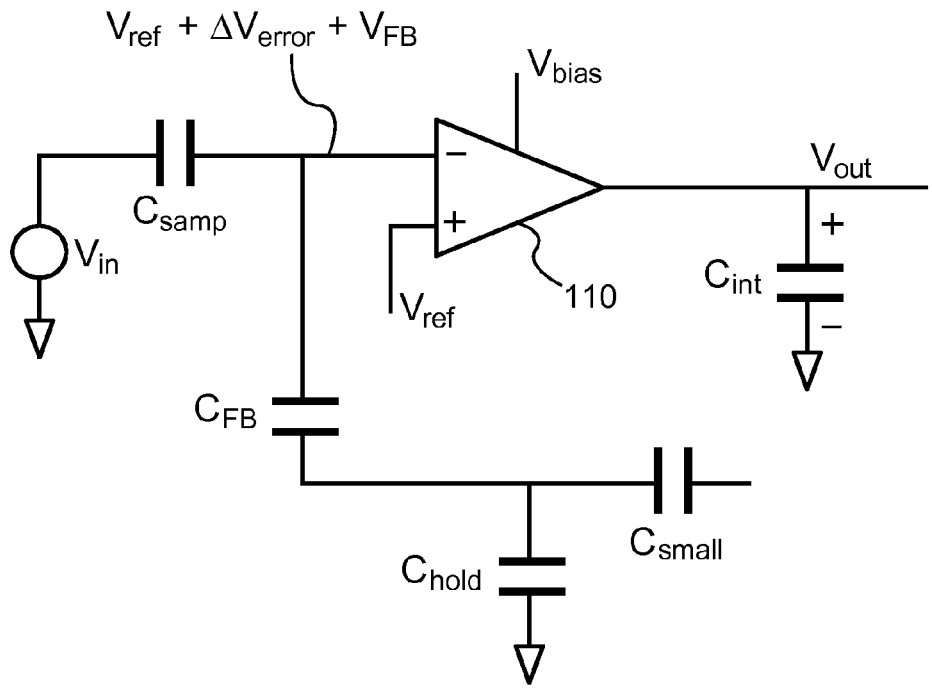
FIG. 14 is a circuit diagram illustrating a state of the sample and hold circuit 100 during time period t4.

The time period t4 is a brief transitional time period, in which the switch SW4 is opened to disconnect the capacitive feedback loop of the error correction circuit 120 portion from the capacitor $C_{int}$. All other switches remain the same as before, i.e. SW1 and SW3 remain opened, whereas SW2 and SW5 remain closed. The state of the circuit in time period t4 is shown in FIG. 14.

Figure 15:
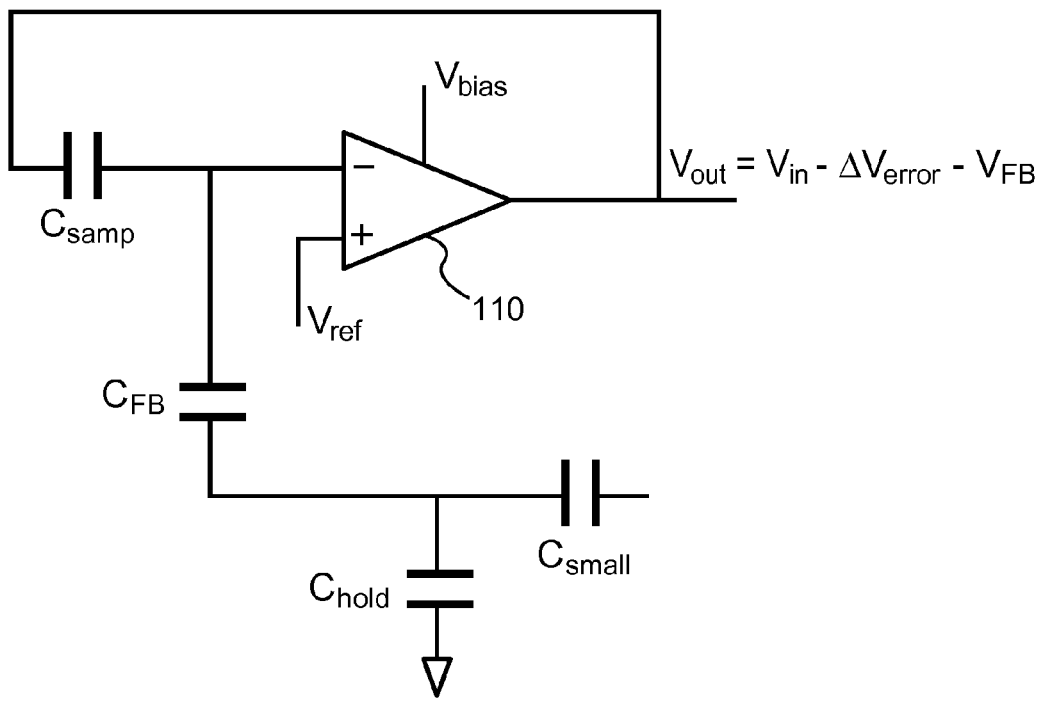
FIG. 15 is a circuit diagram illustrating a state of the sample and hold circuit 100 during time period t5.

In time period t5, switches SW2 and SW5 are opened, and switch SW3 is closed. Switches SW1 and SW4 are not changed (they remain opened). The state of the circuit is shown in FIG. 15. Assuming the input resistance and gain of the amplifier 110 is infinite, when the switch SW3 is closed and the switch SW2 is opened the output voltage $V_{out}$ of the amplifier 110 is driven up to the voltage $V_c$ on the sampling capacitor $C_{samp}$ plus the voltage $V_{ref}$. Because the error $\Delta V_{error}$ was canceled out in time period t3, the voltage of the sampling capacitor at the start of time period t5 is $V_c = V_{in\_t1} - V_{ref}$. Thus, the output of the circuit becomes $V_{out} = V_c + V_{ref} = (V_{in\_t1} - V_{ref}) + V_{ref} = V_{in\_t1}$. In other words, in time period t5 the voltage of the output signal $V_{out}$ equals the sampled voltage ($V_{in\_t1}$) of the input signal $V_{in}$ without any of the error $\Delta V_{error}$.

Thus, the S/H circuit 100 is able to measure (samples) the voltage of the input signal $V_{in}$ at the timing t1 (i.e., the voltage $V_{in\_t1}$) and thereafter output a constant signal $V_{out}$ corresponding to the measured voltage, i.e. $V_{out}=V_{in\_t1}$ independent of errors caused by charge injection ($\alpha$) and time variant noise ($\gamma$).

Note that switch SW5 is intended to remove the load $C_{int}$ from the amplifier 110 if needed during the time of "hold" (i.e., time period t5). However, switch SW5 may be omitted if the removal of the load $C_{int}$ is not necessary or desired.

Furthermore, although the error correction circuit 120 is shown to include feed-back loop capacitors $C_{small}$, $C_{hold}$, and $C_{FB}$, more or fewer feedback capacitors could be included, and in different configurations than that shown. As long as the feedback capacitor(s) are capable of sampling the integration level $V_{out}$ during time period t3 and feeding back a voltage $\Delta V_{FB}$ to the inverting (negative) input of the amplifier 110, then the operations described above can be carried out, regardless of the number of feed-back loop capacitors included in the circuit.

The approach described above is a feed forward method for cancelling noise. Although the circuit arrangement may appear at first glance to be a feedback arrangement in the sense that the signal travels from the output of the differential amplifier to the input of the amplifier, the noise cancelling approach is actually a feed forward approach because there is no measurement to determine the efficacy of the cancellation and make adjustments based on the measurement. In particular, the magnitude of the voltage $\Delta V_{FB}$ that is fed back to the inverting input of the amplifier 110 depends on the parameters of the circuit, such as the various capacitances, transconductance $g_m$, and time T, and effective noise cancellation is only achieved when the parameters are appropriately controlled prior to feeding back the voltage as part of the correction operation.

[Calibration of the S/H Circuit 100]

As noted above, in order to fully compensate the effect of charge injection ($\alpha$) and noise ($\gamma$), the parameters of the S/H circuit 100 (such as the capacitances of the various capacitors, the transconductance $g_m$ of the amplifier 110, the integration time period T, etc.) should be set such that $$\beta \frac{g_m T}{C_{int}} = 1.$$

Thus, it may be desirable to manufacture a circuit that will include the S/H circuits 100 with initial parameter values that will satisfy this requirement.

However, due to manufacturing variances and the like, the actual parameters of manufactured S/H circuits 100 may vary from the designed values, and therefore it might not be possible, in some applications, to ensure that $$\beta \frac{g_m T}{C_{int}} = 1$$

in the S/H circuit 100 merely by appropriately setting the parameters in the design the S/H circuit 100. Moreover, some of the parameters, such as the transconductance $g_m$, depend on temperature and production process corner, and therefore even if there were no manufacturing variances in the other parameters, it might be impossible to ensure that $$\beta \frac{g_m T}{C_{int}} = 1$$

in all operating conditions. Thus, it may be desirable in some applications to design the components of the S/H circuits 100 such that one or more of the parameters may be altered after the S/H circuit 100 is manufactured in order to calibrate the S/H circuit to satisfy the requirement $$\beta \frac{g_m T}{C_{int}} = 1.$$

For example, variable capacitance capacitors could be used for the capacitor $C_{int}$ and/or one or more of the feedback loop capacitors (e.g., $C_{small}$, $C_{hold}$, $C_{FB}$), which would allow the parameters $\beta$ and $C_{int}$ to be changed in order to calibrate the S/H circuit 100. The integration time T may also be designed to be changeable. In addition, the transconductance $g_m$ of the amplifier 110 may be changed, for example by controlling a bias voltage $V_{bias}$ of the amplifier 110.

In some embodiments, it is preferable to maintain the ratio $$\beta \frac{g_m T}{C_{int}}$$

in a practical circuit to within 10% of the nominal value 1 by controlling the circuit parameters. In other embodiments, it is preferable to maintain the ratio $$\beta \frac{g_m T}{C_{int}}$$

to within 5% of the nominal value 1 by controlling the circuit parameters. In the appended claims, the notation $$\beta \frac{g_m T}{C_{int}} \approx 1$$

means that $$0.9 \leq \beta \frac{g_m T}{C_{int}} \leq 1.1$$

unless otherwise noted in the claim.

In calibrating the S/H circuit 100 by changing parameters thereof, some of these parameters are more advantageously controlled than others. Various approaches to calibration will be discussed further below.

The calibration could be performed repeatedly by repeatedly adjusting one or more of the parameters to ensure that $$\beta \frac{g_m T}{C_{int}}$$

continues to equal one as time passes. For example, the calibration could be performed upon initial manufacture of the device in which the S/H circuit 100 is implemented, and then the calibration could be repeated at predetermined times thereafter, such as after every t seconds of operation of the device. The calibration could also be performed whenever a predetermined event occurs, such as whenever the device is powered up, whenever a sensor in the device outputs a predetermined signal (e.g., a temperatures sensor indicates that the temperature has changed by an amount), whenever a user selects a calibration option, whenever a certain error occurs, etc. The calibration could also be continually performed or updated in order to maintain the S/H circuit 100 continually in a calibrated state.

Changing the integration time T has an impact on the noise and speed of the circuit. The larger T is, the more effectively the error correction circuit 120 can cancel out the time-varying noise γ, because the fluctuations in the random noise are averaged out for a longer period of time. On the other hand, a larger value of T means that the operating speed of the S/H circuit 100 will be lower. Hence, it may be desirable in some applications to choose the integration time T to be as large as possible (thereby most effectively cancelling noise γ) while still satisfying the minimum speed (data throughput) requirements of the circuit 100. Thus, selecting T as the parameter to change in order to calibrate the S/H circuit may mean forgoing the benefit resulting from setting T to the largest value that meets throughput requirements.

Changing the capacitance of the capacitor $C_{int}$ and/or the capacitance(s) of one or more of the feedback loop capacitors (e.g., $C_{small}$, $C_{hold}$, $C_{FB}$) can be another method of calibrating the S/H circuit 110. For example, as noted above, variable capacitance capacitors could be used for one or more of the capacitors $C_{int}$, $C_{small}$, $C_{hold}$, and $C_{FB}$. However, in some applications, the extent of control that is available using passive components such as capacitors may not be as good as that available using active components. In other words, it may be impractically difficult to achieve sufficiently precise control over the value of $$\beta \frac{g_m T}{C_{int}}$$

by controlling the capacitances. For example, it may be practically infeasible (e.g., too costly, too much increase in circuit size, too much increase in manufacturing process complexity, etc.) to implement a circuit 100 that has variable capacitance capacitors that can vary their capacitance with sufficient precision to keep $$\beta \frac{g_m T}{C_{int}}$$

sufficiently close to one, e.g., within 10% of 1 in a preferred embodiment, to achieve the desired level of noise cancellation.

Changing the transconductance $g_m$ of the amplifier 110 can be another good method of calibrating the S/H circuit 110. Moreover, since the transconductance $g_m$ can be controlled using active components, in some applications the extent of control over the calibration is improved as compared to the case of controlling the capacitance of the capacitors. In particular, according to some of the methods discussed below the transconductance $g_m$ of the amplifier 110 can be controlled continuously and automatically, thus ensuring that the S/H circuit 100 always operates optimally despite changing conditions or process corner.

The transconductance $g_m$ of the amplifier 110 may be controlled by modifying the bias voltage $V_{bias}$ of the input stage transistors in the differential amplifier 110. A first calibration method includes directly setting a value of the bias voltage $V_{bias}$ to an appropriate value based on a knowledge of the other design parameters. The value of the bias voltage $V_{bias}$ may then be varied automatically from this initial value as conditions change in order to keep the transconductance $g_m$ at the desired value. A second calibration method includes setting a value of the bias voltage $V_{bias}$ by an iterative process that involves using a pair of S/H circuits 100 and injecting artificial error into one of the circuits 100 each iteration and adjusting $V_{bias}$ based on a difference between the outputs of the circuits.

Figure 16:
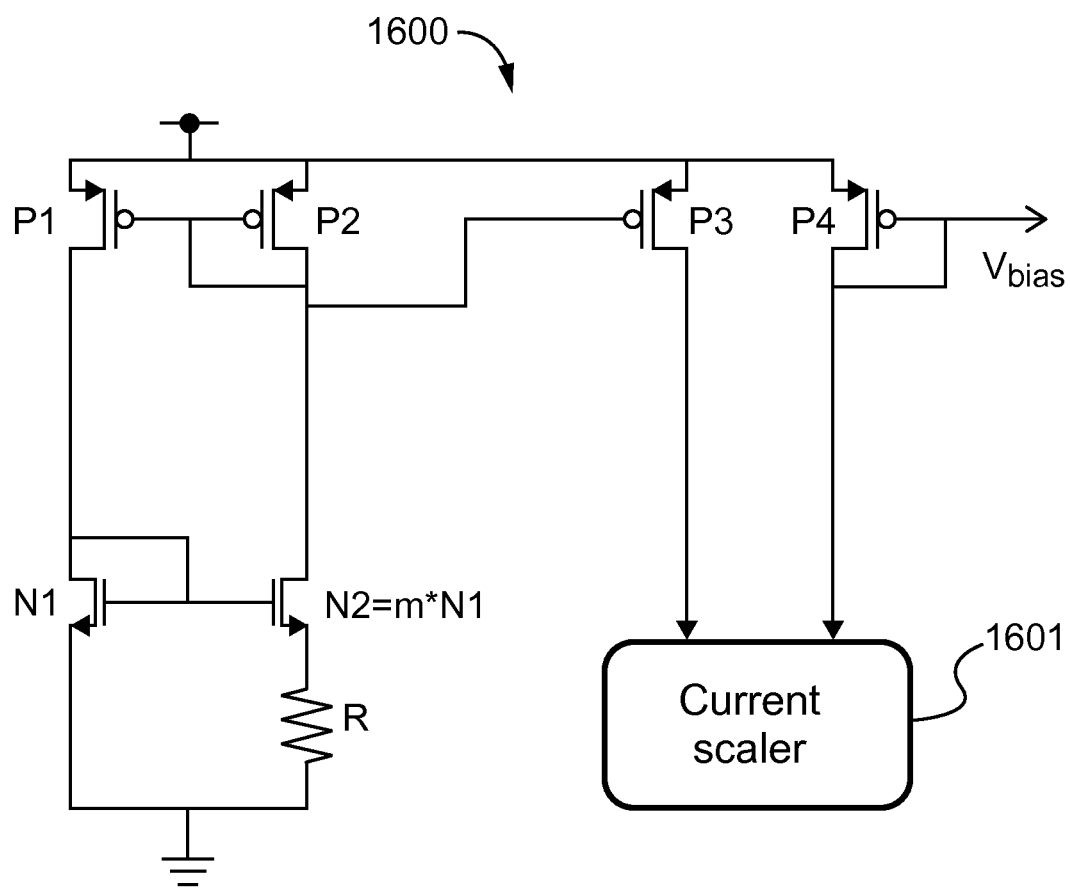
FIG. 16 is a circuit diagram illustrating bias voltage generation circuit 1600.

The above-mentioned first method to calibrate the circuit 100 includes directly setting the bias voltage $V_{bias}$ to an initial value. For example, a bias voltage generation circuit 1600 such as the one illustrated in FIG. 16 can be used to generate a bias voltage $V_{bias}$. The bias voltage generation circuit 1600 outputs the bias voltage $V_{bias}$, whose magnitude depends on a magnitude of a bias current $I_{bias}$ that is fed from transistor P3 into the current scalar 1601 and on a setting of the current scaler 1601. The current scaler 1601 can be set to different settings by inputting control signals thereto. For example, digital values may be input to the current scaler 1601, with each digital value causing the bias voltage $V_{bias}$ to take a different value. For example, an 8-bit scaling digital-to-analog circuit may be included in the current scaler 1601, allowing for $V_{bias}$ to be set to 256 possible levels.

The desired value of the transconductance $g_m$ that would ensure that $$\beta \frac{g_m T}{C_{int}} = 1$$

may be determined mathematically based on a knowledge of the design parameters of the circuit 100 (e.g., a knowledge of the design-specified capacitances of $C_{int}$, $C_{small}$, $C_{hold}$, $C_{FB}$ and the value set for T). The value of the initial bias voltage $V_{bias}$ that should be set in order to obtain the desired value for $g_m$ may be estimated based on a mathematical model of the relationship between $V_{bias}$ and $g_m$ and on a knowledge of relevant parameters (e.g., current temperature). Alternatively, the value of the bias voltage $V_{bias}$ that would generate the desired $g_m$ may be determined experimentally by repeatedly measuring the transconductance $g_m$ of the amplifier 110 and changing $V_{bias}$ until the desired value for $g_m$ is reached. The transconductance $g_m$ may be measured, for example, by inputting a known differential voltage to the amplifier 110 and then measuring an output current of the amplifier 110 (yielding the transconductance $g_m$ via equation 5).

Once an appropriate initial value for $V_{bias}$ is set, the bias voltage generation circuit 1600 may also include a function of automatically varying the value for $V_{bias}$ so as to keep the transconductance $g_m$ of the amplifier 110 constant. In particular, the transconductance $g_m$ of the amplifier 110 will vary as temperature changes, and thus if the value of $V_{bias}$ is not varied from the initial value, then the transconductance $g_m$ may depart from the desired value as temperature changes. Thus, the bias voltage generation circuit 1600 shown in FIG. 16 has a function of automatically varying the bias voltage $V_{bias}$ after an initial value thereof has been set so as to keep $g_m$ constant. For example, the bias voltage generation circuit 1600 includes p-type CMOS transistors P1, P2, P3, and P4 and n-type CMOS transistors N1 and N2, and a current scaler 1601. The transistors P1, P2, N1, and N2 form a feedback loop which produces a current $I_{bias}$ that depends on the transconductance of the transistors N1 and N2. In particular, the loop is configured such that the current $I_{bias}$ will vary in such a way as to keep the transconductance $g_{m_{N1}}$ of the transistor N1 approximately constant. This current $I_{bias}$ is mirrored from transistor P2 to transistor P3 and fed into the current scalar 1601.

The voltage generation circuit 1600 automatically varies the value for $V_{bias}$ so as to keep the transconductance $g_m$ of the amplifier 110 constant as follows. In the face of a temperature change $\delta T°$, the transconductance of a transistor would normally change if not compensated for. However, due to the configuration of the voltage generation circuit 1600, in the face of a temperature change $\delta T°$, the current $I_{bias}$ automatically changes by an amount $\delta I_{bias}$ that tends to keep the transconductance $g_{m_{N1}}$ of the transistor N1 approximately constant despite the temperature change. In other words, the change in temperature $\delta T°$ causes a change in current $\delta I_{bias}$ sufficient to ensure that $\delta g_{m_{N1}} \approx 0$, where $\delta g_{m_{N1}}$ is a change in transconductance of the transistor N1. The change in bias current $\delta I_{bias}$ causes a corresponding change in the bias voltage $\delta V_{bias}$. If the amplifier 110 comprises transistors matching the transistor N1, then the change in the bias voltage $\delta V_{bias}$ should be sufficient to ensure that the transconductance of the amplifier 110 also remains constant despite the temperature change. In other words, the temperature change $\delta T°$ causes a change in current $\delta I_{bias}$ sufficient to ensure that $\delta g_{m_{N1}} \approx 0$, which in turn causes a change in bias voltage $\delta V_{bias}$ that is sufficient to ensures that $\delta g_{m_{AMP}} \approx 0$. This result occurs because an un-compensated change in the transconductance of the amplifier 110 due to the temperature change $\delta T°$ should be approximately the same as un-compensated change in the transconductance of the transistor N1, and because $\delta I_{bias}$ is sufficient to counter the un-compensated change in the transconductance of the transistor N1, $\delta V_{bias}$, which is based on $\delta I_{bias}$, should also tend to cancel out the un-compensated change in the transconductance $g_m$ of the amplifier 110.

Thus, the bias voltage generation circuit 1600 is capable of keeping an initially set transconductance $g_m$ approximately constant across wide temperature operating ranges and production process corners. In this context, "approximately constant" means within ±5% of the initially set value. If the transconductance $g_m$ of the amplifier 110 varies by ±5% from the properly tuned value $g_m^*$ $$\left(\text{where } \beta \frac{g_m^* T}{C_{int}} = 1\right),$$

then it is ensured that at least about 95% of the noise represented by $\Delta V_{error}$ will be canceled out by the operations of the error correction circuit 120. This reduces the noise from $\Delta V_{error}$ to levels that are negligible when compared to other sources of noise (such as pixel noise and ADC quantization noise when the S/H circuit 100 is included in an imager).

A second method to calibrate the S/H circuit 100 by changing $g_m$ is to compare an output from a S/H circuit 100A that has an artificial error deliberately injected at the sampling moment to an otherwise identical S/H circuit 100B without such an error injection. By comparing the outputs of these two circuits, the properly tuned value of the transconductance can be determined.

Figure 17:
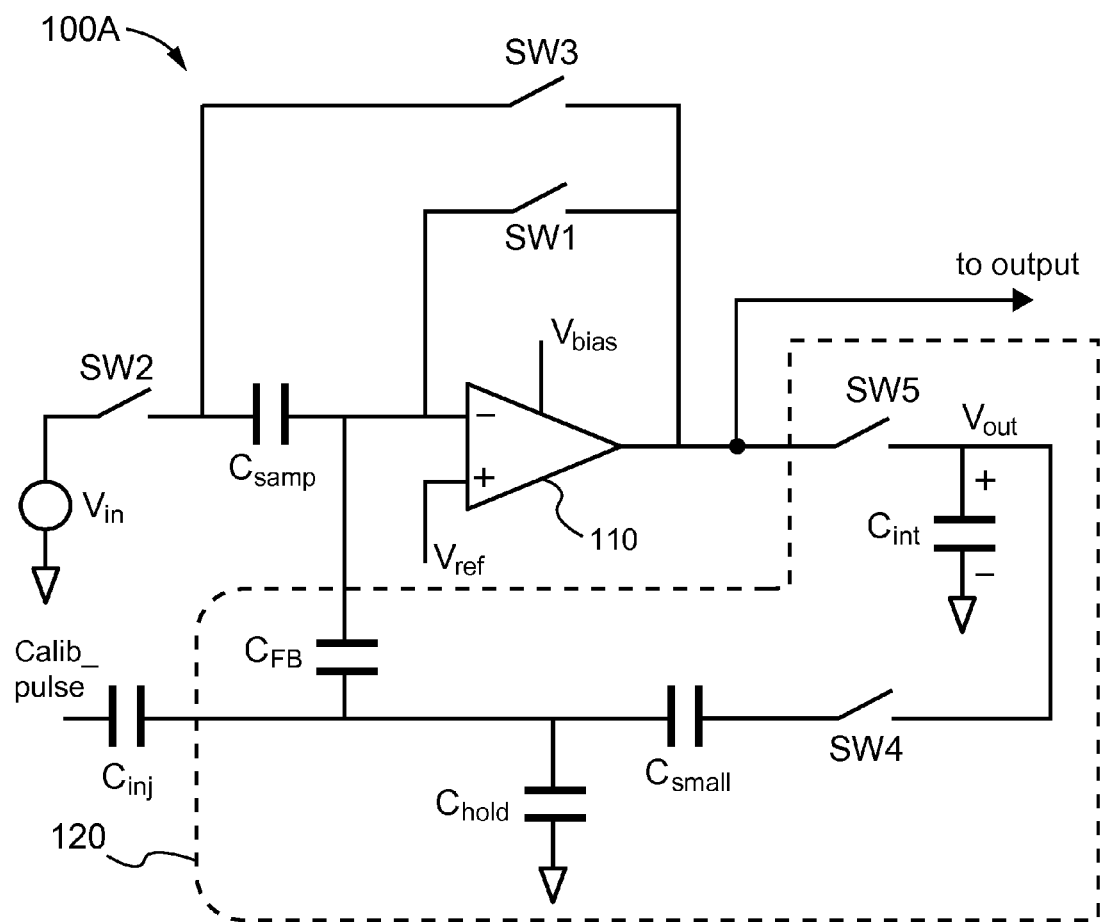
FIG. 17 is a circuit diagram illustrating a sample and hold circuit 100A with an error correction portion 120 having a calibration function.

In order to calibrate the S/H circuits 100A and 100B by this method, the S/H circuit 100A must be configured to receive the injected error. FIG. 17 illustrates an example of the S/H circuit 100A configured to receive the injected error. The circuit 100A is identical to the circuit 100, except for the addition of capacitor $C_{inj}$, which is connected to the capacitive feedback section of the error correction circuit 120. The capacitor $C_{inj}$ allows the circuit 100A to receive the injected error. In particular, an external pulse Calib_pulse is injected into the capacitive feedback path of the S/H circuit 100A via $C_{inj}$. In the specific example of FIG. 17, Calib_pulse is coupled by $C_{FB}$ to the negative input terminal of the differential amplifier 110. However, the external pulse Calib_pulse could be injected at different locations in the feedback path, as long as the location of injection is such that the pulse causes a voltage boost to one of the inputs of the amplifier 110.

Figure 19:
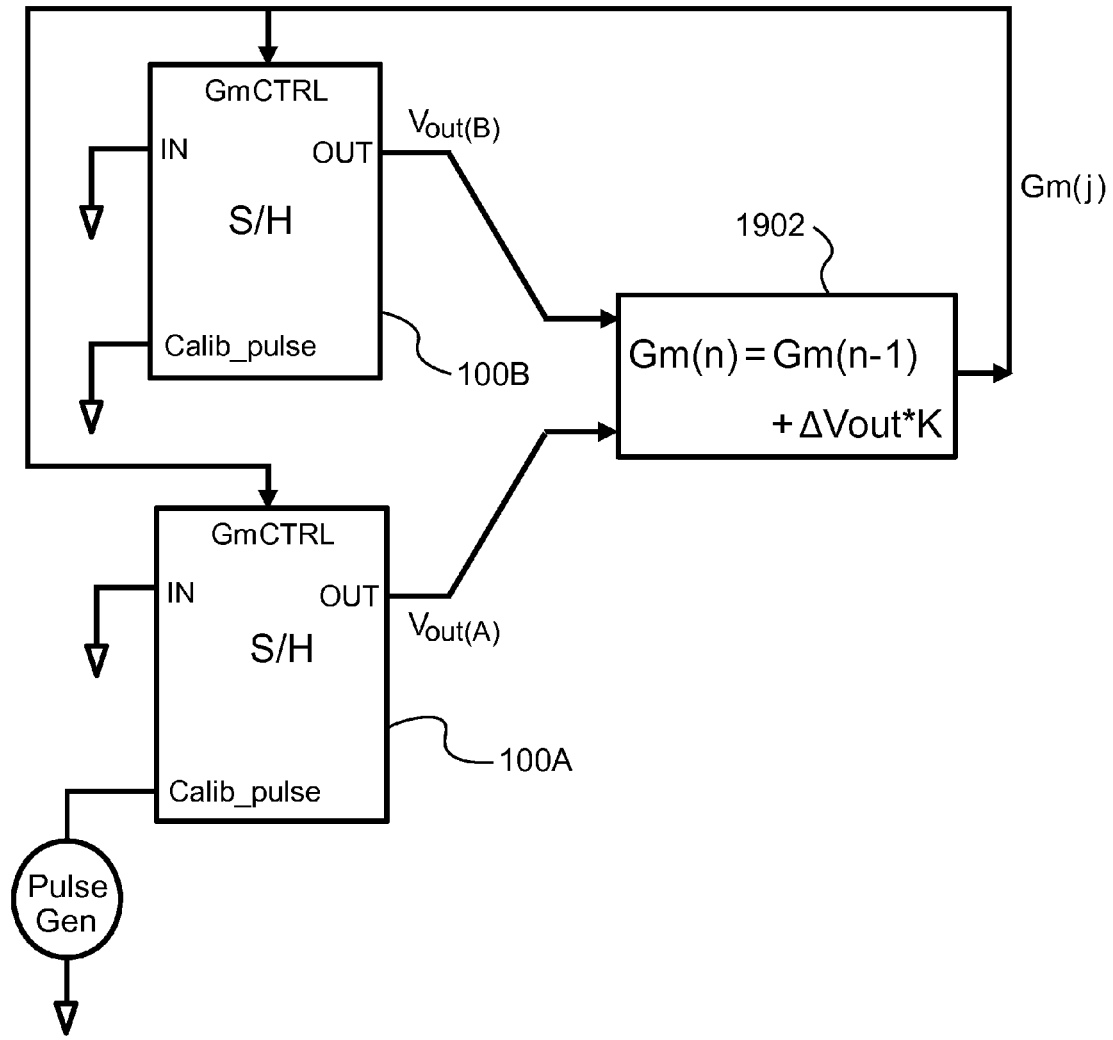
FIG. 19 is a conceptual diagram illustrating a calibration unit for calibrating the sample and hold circuit 100A.

FIG. 19 illustrates schematically how the S/H circuits 100A and 100B are tuned by artificial error injection. The S/H circuits 100A and 100B may be calibrated by iteration over a number of calibration time periods, with the S/H circuits 100A and 100B sampling the same input signal as one another in each calibration time period and with the S/H circuit 100A having the calibration pulse Calib_pulse applied thereto each calibration time period. Specifically, the calibration input terminal (e.g., capacitor $C_{inj}$) of the S/H circuit 100A is connected to a calibration pulse generating circuit 1901, which supplies a calibration pulse Calib_pulse once per calibration time period. The S/H circuit 100B does not have Calib_pulse applied thereto. The outputs of the circuits 100A and 100B, $V_{out(A)}$ and $V_{out(B)}$ respectively, are fed into a calibration unit 1902, which generates a control signal Gm(j) based on the outputs $V_{out(A)}$ and $V_{out(B)}$. The control signal Gm(j) controls the transconductance $g_m$ of the amplifiers 110 of the circuits 100A and 100B. For example, the control signal Gm(j) could be a bias voltage of the amplifiers 110 of the circuits 100A and 100B. As another example, the control signal Gm(j) could be used to control a bias voltage generation circuit that generates the bias voltage of the amplifiers 110 of the circuits 100A and 100B (such as the bias voltage generation circuit 1600 discussed above).

Figure 18:
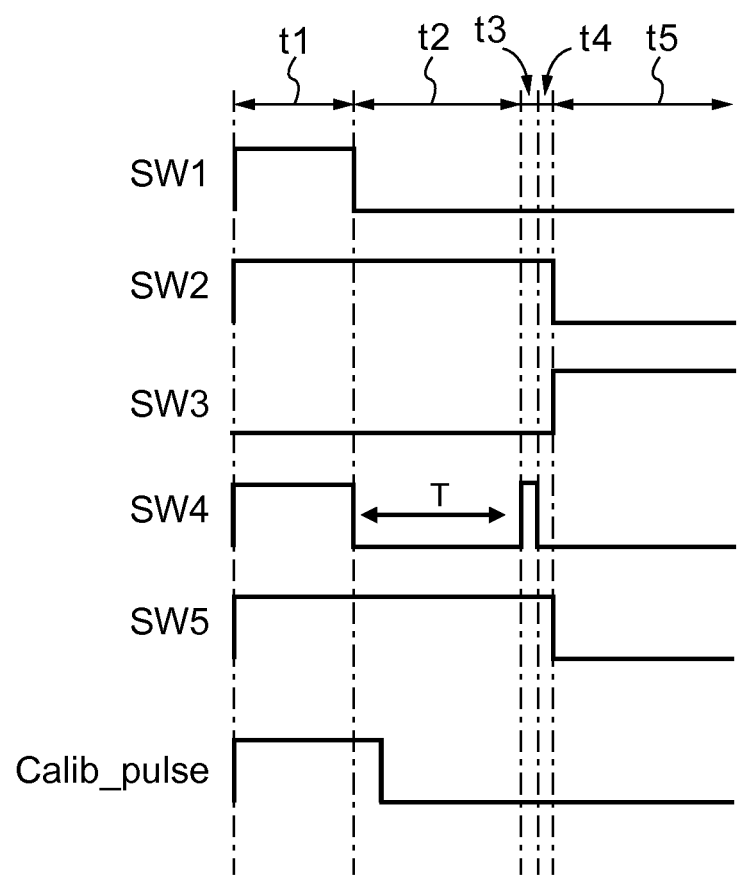
FIG. 18 is a timing diagram illustrating operations of the sample and hold circuit 100A.

FIG. 18 illustrates an operation of calibrating the S/H circuit 100A during one calibration period. The calibration operation of the S/H circuit 100A is identical to the sampling operation of the S/H circuit 100 shown in FIG. 10, except with the addition of the Calib_pulse waveform. As shown in FIG. 18, Calib_pulse is applied to the circuit 100A in time period t1, and is maintained until slightly after the end of time period t1 (Calib_pulse goes low partway into time period t2). Because Calib_pulse falls after the closing of switch SW1, an artificial error $\Delta V_{calib}$ is injected onto the inverting input terminal of the amplifier 110. The errors from $\Delta V_{cinj}$ and $\Delta V_{noise}$ discussed above are also introduced in the normal fashion, and thus by the end of time period t2 the voltage of the differential input voltage of the amplifier 110 of the circuit 100A is $\Delta V_{error(A)} = \Delta V_{cinj(A)} + \Delta V_{noise(A)} + \Delta V_{calib}$. On the other hand, the circuit 100B (which does not receive Calib_pulse) has the differential input voltage $\Delta V_{error(B)} = \Delta V_{cinj(B)} + \Delta V_{noise(B)}$ at the end of time period t2. Assuming that $\Delta V_{cinj(A)} + \Delta V_{noise(A)} \approx \Delta V_{cinj(B)} + \Delta V_{noise(B)}$ (since the circuits are essentially identical), we have that $\Delta V_{error(A)} \approx \Delta V_{error(B)} + \Delta V_{calib}$. Thus, the S/H circuits 100A and 100B will each have a different amount of error when time period t3 (error correction operation) begins.

If the transconductance $g_m$ of the S/H circuits 100A and 100B is not at the properly tuned value (call it $g_m^*$), then the respective errors in the circuits will not be completely canceled out by the error cancellation procedure. In particular, the error remaining in the circuit 100A after error cancellation will be $$\left(1 - g_m \frac{\beta T}{C_{int}}\right)(\Delta V_{error(B)} + \Delta V_{calib}),$$

and the error remaining in the circuit 100B will be $$\left(1 - g_m \frac{\beta T}{C_{int}}\right)\Delta V_{error(B)}.$$

Thus, the difference in the outputs $V_{out(A)}$ and $V_{out(B)}$ will be given by:

$$V_{out(A)} - V_{out(B)} = \left(1 - g_m \frac{\beta T}{C_{int}}\right)\Delta V_{calib} \quad \text{(eq. 10)}$$

Since $$g_m^* \frac{\beta T}{C_{int}} = 1,$$

equation 10 reduces to:

$$g_m^* - g_m = \frac{V_{out(A)} - V_{out(B)}}{\Delta V_{calib} \frac{\beta T}{C_{int}}} \quad \text{(eq. 11)}$$

Thus, considering equation 11 it is apparent that as $g_m$ approaches $g_m^*$, the difference $V_{out(A)} - V_{out(B)}$ must approach zero. This means that the calibration unit 1902 can find the properly tuned value $g_m^*$ by iteratively changing the value of $g_m$ until the difference in output voltage $V_{out(A)} - V_{out(B)}$ equals zero (or is within a predetermined threshold amount from zero). When $V_{out(A)} - V_{out(B)} = 0$ (or when $|V_{out(A)} - V_{out(B)}| \leq \epsilon$), where $\epsilon$ is the predetermined threshold value), the calibration unit 1902 may set the current value of $g_m$, which equals the properly tuned value $g_m^*$, to be the calibrated value for $g_m$.

In particular, calibration unit 1902 may iteratively determine the calibrated value for $g_m$ as follows. Each calibration time period j, the calibration unit 1902 integrates the difference between $V_{out(A)}$ and $V_{out(B)}$, and outputs the control signal $G_m(j)$ based thereon. In an $n^{th}$ calibration time period, the control signal $G_m(n)$ equals the $(n-1)^{th}$ time period's control signal, $G_m(n-1)$, plus an amount proportional to the difference between $V_{out(A)}$ and $V_{out(B)}$ for the $n^{th}$ time period. In other words, for the $n^{th}$ time period $G_m(n) = G_m(n-1) + k(V_{out(A)} - V_{out(B)})$, where k is a gain parameter of the calibration unit 1902. Each calibration time period j, the control signal from the previous time period $G_m(j-1)$ is used to control the transconductance $g_m$ of the circuits 100A and 100B (for example, the control signal $G_m(j)$ may be the bias voltage $V_{bias}$, or a signal that controls the value of the bias voltage $V_{bias}$). This calibration procedure is iteratively repeated over a number of calibration time periods until $V_{out(A)} - V_{out(B)} = 0$ (or until $|V_{out(A)} - V_{out(B)}| \leq \epsilon$). The speed of convergence to the calibrated value will depend on the gain parameter k.

For example, the calibration unit 1902 may be formed by a unity-gain differential amplifier (not illustrated) and an integrator (not illustrated). The outputs $V_{out(A)}$ and $V_{out(B)}$ may be applied to the unity-gain differential amplifier, which performs a function of subtracting $V_{out(B)}$ from $V_{out(A)}$. The output of the unity-gain differential amplifier ($V_{out(A)}$–$V_{out(B)}$) is input to the integrator, which integrates the difference over time. The output of the integrator each calibration time period j is $G_m(j)$, and the aforementioned parameter k is the gain parameter of the integrator. The integrator may be an analog integrator (such as a switched capacitor analog integrator) or a digital integrator. If an analog integrator is used, the integrator can be directly used in the same circuit as the S/H circuits 100A and 100B. If the digital integrator is used, an analog-to-digital converter may be included to convert $V_{out(A)}$–$V_{out(B)}$ into digital form, the digital values may then be fed into the digital integrator, and the output of the digital integrator may be fed into a digital-to-analog converter to obtain $G_m(j)$. The gain parameter k may be controlled, for example, by controlling a ratio of capacitors in the integrators.

The iterative calibration method discussed above may be combined with the bias voltage generation circuit 1600 discussed above. For example, the iterative calibration method may be used to find an initial bias voltage $V_{bias}$ to be used by the bias voltage generation circuit 1600. Thereafter, the bias voltage generation circuit 1600 may vary the value of the bias voltage $V_{bias}$ as needed to keep the transconductance $g_m$ of the amplifier 110 at the calibrated value $b_m^*$. In particular, if the control signal $G_m(j)$ of the calibration unit 1902 is in fact the bias voltage applied to the amplifiers 110 of the circuits 100A and 100B, then the initial value of $V_{bias}$ may be set so as to equal $G_m(j)$. Alternatively, the control signal $G_m(j)$ of the calibration unit 1902 may be input to the bias voltage generation circuit 1600 as a control signal—for example, as the digital signal that controls the current scaler 1601 (in such a case, the control signal $G_m(j)$ may be converted from analog-to-digital form if it is not already in digital form).

In a device that includes multiple S/H circuits 100, such as the image sensor 2000 discussed below, the calibration may be performed in a number of ways. In the following discussion "operational" S/H circuits 100 will refer to S/H circuits 100 that take part in sampling operations of the device (such as S/H circuits 100 that read pixel signals in the image sensor 2000) in order to distinguish them from S/H circuits 100 that are dedicated only to calibration (discussed below). For example, all of the operational S/H circuits 100 could be paired with another of the operational S/H circuits 100 for purposes of calibration, such that half of the operational S/H circuits 100 in the device are circuits 100A and half are circuits 100B for purposes of calibration, and each pair could be calibrated each time the calibration operation is performed. An advantage of this approach is that because each pair of S/H circuits 100 is individually calibrated, differences between parameters of the S/H circuits 100 (due to manufacturing variances and the like) can be accommodated, allowing more accurate control of the transconductance. As another example, only one pair of the operational S/H circuits 100 could be calibrated each calibration operation, and the control signal $G_m(j)$ obtained by the calibration operation for that one pair could be used to control the transconductance of each of the operational S/H circuits 100 in the device. An advantage of this approach is that using only one pair of S/H circuits 100 for calibration allows for simpler circuit configuration, less power consumption, and, when the approach is combined with the bias voltage generating circuit 1600, the approach allows for the use of only one bias voltage generating circuit 1600 (instead of a different bias voltage generating circuit 1600 for each calibration pair). As another example, a pair of calibration circuits 100A and 100B that are dedicated only to calibration could be provided, and the control signal $G_m(j)$ obtained by the calibration operation for the calibration pair could be used to control the transconductance of the operational S/H circuits 100 in the device. An advantage of this approach is that a calibration operation can be performed independently of the sampling operations of the operational S/H circuits 100, which allows for more flexible scheduling of the calibration operation; for example, the calibration operation could be performed by the calibration pair continually in the background to ensure that the transconductance always remains at the correct value, without interfering with the normal operation of the operational S/H circuits 100.

The iterative calibration method described above may also be performed to calibrate the capacitance of variable resistance capacitors. The circuit configuration and operation would be identical as that discussed above, with the exception that the control signal $G_m(j)$ would control the capacitance of the variable resistance capacitor instead of the value of $g_m$.

[Configuration of Image Sensor]

Figure 20:
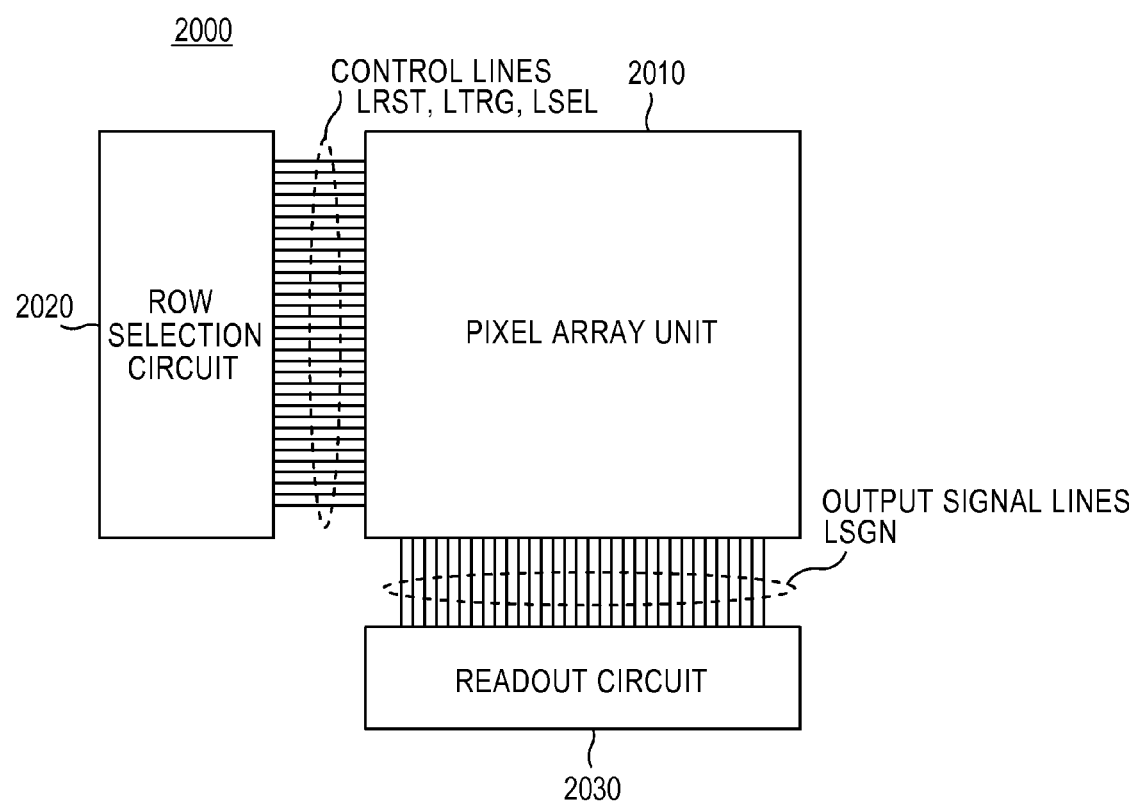
FIG. 20 is a conceptual diagram illustrating an image sensor 2000.

The S/H circuits 100, 100A, and 100B may be beneficially used in an image sensor, such as the image sensor 2000 shown in FIG. 20. The image sensor 2000 includes a pixel array unit 2010, a row selection circuit 2020, control lines (e.g., LRST LTRG, LSEL), a readout circuit 2030, and output signal lines LSGN. The pixel array unit 2010 includes multiple pixels 2010A arrayed in a pattern (not illustrated). The row selection circuit 2020 may apply control signals to the control lines and thereby control operations of the pixels 2010A. Pixel signal values may be readout out from the pixels 2010A of the pixel array to the readout circuit 2030 through the output signal lines LSGN. The readout circuit 2030 may perform various types of signal processing on the pixel signal values, such as error correction, correlated double sampling, and analog-to-digital conversion, and then serially output pixel data based on the processed pixel signal values. Pixel data output by the readout circuit 2030 can be subjected to further processing, and ultimately is combined to form image data describing an image that was incident on the pixel array 2010 during an exposure period. The readout circuit 2030 will be discussed in greater detail below.

In one embodiment, the pixels 2010A are arrayed in a pattern of horizontal rows and vertical columns, the pixels 2010A are controlled in units of a row (i.e., an entire row of pixels 2010A is selected at the same time) and are read out row-sequentially, and each signal line LSGN corresponds to one column of the pixel array. However, other patterns of arraying the pixels, other scanning methods, and other signal line configurations are all possible. For example, the pixels 2010A may be divided into arbitrary groups that each share a signal line LSGN, each Bayer quadrant may share a signal line LSGN, each predetermined area of the pixel array may share a signal line LSGN, multiple columns may share a signal line LSGN, and so on.

Figure 21:
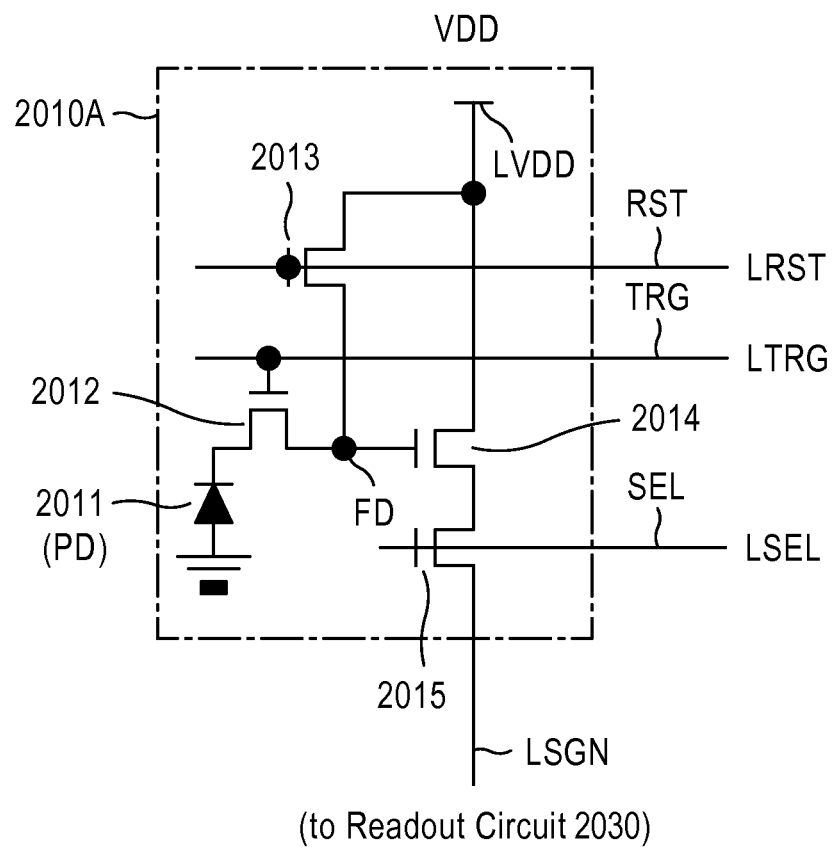
FIG. 21 is a circuit diagram illustrating a pixel circuit 2010A.

FIG. 21 illustrates an exemplary pixel 2010A. The pixel 2010A may include, for example, a photodiode ("PD") 2011, a transfer transistor 2012, a floating diffusion ("FD"), a reset transistor 2013, an amplifier transistor 2014, and a readout transistor 2015. The PD converts light into charge during an exposure period, with the amount of charge that is produced being based on the amount of light incidence on the PD during the exposure period (as well as on various sources of noise, such as thermal noise, leakage from adjacent components, etc.). A reset operation, which is described below, may be completed prior to a start of the exposure period. A mechanical shutter operating may begin the exposure period, or the exposure period may begin with an electronic shutter operation (for example, the ending of the reset operation may begin the exposure period). At the end of the exposure period, the charge is transferred to the FD via the transfer transistor 2012 under control of the signal TRG applied to the control line LTRG. The FD integrates the charge into a voltage, which is applied to the gate of the amplifier transistor 2014. When the readout transistor 2015 is turned on by the control signal SEL applied to the control line LSEL, a signal from the amplifier transistor 2014 is applied to the output signal line LSGN. The signal from the amplifier transistor 2014 is based on the voltage held in the FD, which in turn is based on the amount of charge that was converted by the PD, which is based on the amount of light incident on the PD during the exposure period. Thus, the signal read out to the signal line LSGN (a pixel signal value) is indicative of an amount of light incident on the PD during the exposure period (plus some noise). The pixel signal values read out to the output signal lines LSGN are read into the readout circuit 2030 in parallel, from whence they are read out serially as pixel data. After the pixel signal value of the pixel 2010A is read out, the aforementioned reset operation may be performed again to reset the pixel for a next exposure period (i.e., a next image frame if the imaging device is capturing video images). The reset operation comprises turning on the reset transistor 2013 and the transfer transistor 2012 by the control signals RST and TRG, respectively, and thereby clearing out any accumulated charges in the FD and the PD. In addition, a signal (i.e., a reset signal) may be read out from the pixel 2010A after performing the reset operation but before charges from the PD are transferred to the FD. This reset signal indicates a reset potential of the FD, and can be used in noise cancellation techniques, such as correlated double sampling.

The above-described pixel 2010A is merely exemplary, and it will be understood that various components could be added to, removed from, or rearranged within the pixel 2010A as described, and that the operations other than those described above could be performed. For example, additional transistors and storage elements could be included in the pixel 2010A to facilitate electronic global shutter operations. As another example, multiple PDs may share a single FD, amplifier transistor 2013, and readout transistor 2015.

Figure 22:
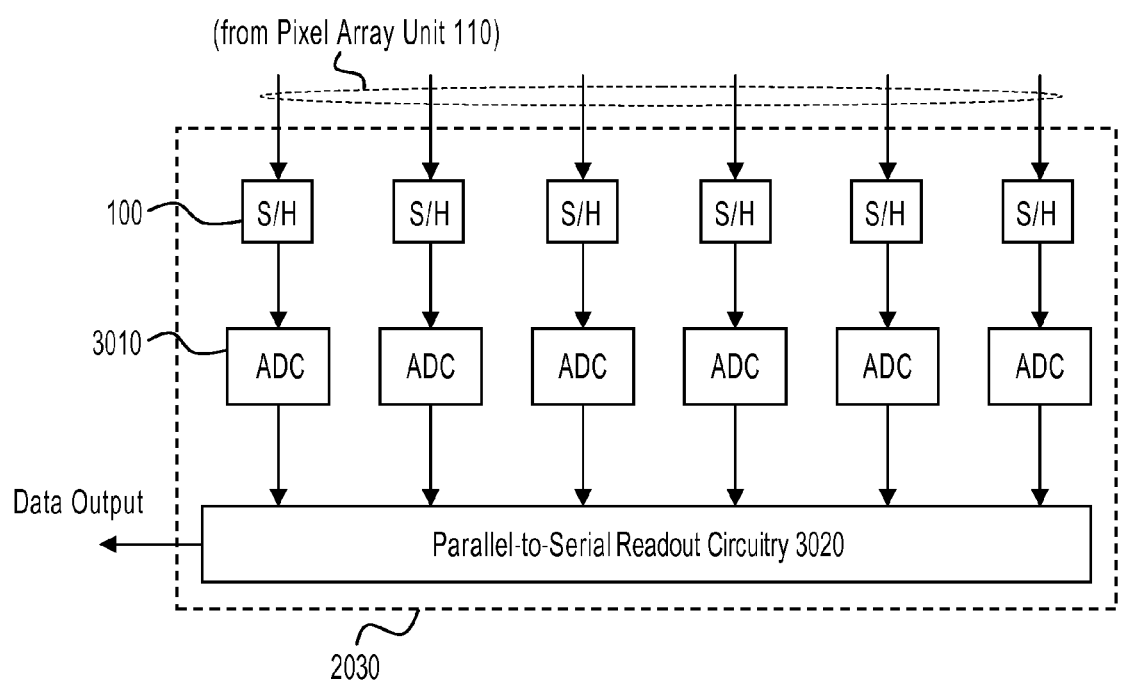
FIG. 22 is a conceptual diagram illustrating readout circuit 2030.

FIG. 22 illustrates an example of the readout circuit 2030. The exemplary readout circuit 2030 includes a S/H circuit 100 for each signal line LSGN, an ADC block 3010 connected to the output of each S/H circuit 100, and a parallel-to-serial readout circuitry 3020. Each S/H circuit 100 samples and holds the signals that are output to its corresponding signal line LSGN, such as a reset signal that is output to the signal line LSGN during a pixel reset operation or the pixel signal that is output to the signal line during a pixel readout operation. Each ADC block 3010 receives the sampled signals from the corresponding S/H circuit 100, processes the signals, and outputs digital pixel values in parallel to the parallel-to-serial readout circuitry 3020. The parallel-to-serial readout circuitry 3020 reads out the digital pixel values serially.

In one embodiment, each ADC block 3010 includes an analog-to-digital converter ("ADC") (not illustrated), which converts the analog signal output by the corresponding S/H circuit 100 into digital from (i.e., a digital pixel value). The ADC may be any form of ADC, such as a single slope ADC, an SAR ADC, a pipelined ADC, a Delta-Sigma ADC (also known as Sigma-Delta ADC, $\Delta\Sigma$ADC, or $\tau\Delta$ADC). The digital pixel value output by the ADC may be any form of digital value, such as a binary number composed of a predetermined number of bits, or a series of counter pulses, where the number or frequency of pulses represents the quantized magnitude (voltage) of the sampled analog pixel signal.

The ADC blocks 3010 may also perform other forms of processing besides analog-to-digital conversion. For example, the ADC blocks 3010 may perform correlated double sampling ("CDS"). An analog CDS circuit may be included in each of the ADC blocks 3010, or the ADC itself may perform a CDS function. If an analog CDS circuit is included, the S/H circuit 100 may be included in addition to the CDS circuit (e.g., between a signal line LSGN and the CDS circuit), or alternatively the signal lines LSGN may connect directly to the CDS circuits, and the S/H circuit 100 may be included as one of the components of the CDS circuit. For example, the CDS circuit could include two S/H circuits 100 connected in parallel to the signal line LSGN, one that samples the reset signal and the other that samples the pixel signal as part of a CDS operation. The ADC blocks 3010 may include other non-illustrated components, such as amplifiers, noise cancellation circuitry, and so on.

The parallel-to-serial readout circuit 3020 may also include S/H circuits 100. For example, one type of parallel-to-serial readout circuit 3020 may include a bus, an S/H circuit 100 for each bit output by the ADC blocks 3010, and a tri-state buffer for each S/H circuit 100 that is connected between the output of the S/H circuit 100 and the bus. The bits of the digital pixel values output by the ADCs are temporarily held by their corresponding S/H circuit 100, and then the tri-state buffers are controlled such that one buffer drives the bus per clock cycle to output the bit held in its corresponding S/H circuit 100. Alternative forms of parallel-to-serial readout circuit may include, for example, a conventional shift register.

Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. A semiconductor device, comprising:
   a sample-and-hold circuit; and
   an error correction circuit comprising an error-current-accumulating capacitor and a feedback circuit, wherein the error correction circuit is configured to perform error correction by:
      accumulating, at the error-current-accumulating capacitor, an error current output from an amplifier of the sample-and-hold circuit, and
      applying, via the feedback circuit, a voltage boost to an input of the amplifier, where the magnitude of the voltage boost depends on a voltage of the error-current-accumulating capacitor.

2. The semiconductor device of claim 1,
   wherein the magnitude of the voltage boost depends on:
      an amount of time T that the error current is accumulated at the error-current-accumulating capacitor;
      a transconductance $g_m$ of the amplifier;
      a capacitance $C_{int}$ of the error-current-accumulating capacitor; and
      a voltage gain $\beta$ of the feedback circuit, and
   the semiconductor device is configured such that $$\frac{\beta g_m T}{C_{int}} \approx 1.$$

3. The semiconductor device of claim 2,
   wherein the semiconductor device is configured such that one or more of the parameters T, $g_m$, $C_{int}$, and $\beta$ is capable of being adjusted as part of a calibration operation.

4. The semiconductor device of claim 2, further comprising:

a bias voltage generating circuit that is configured to generate a bias voltage that controls $g_m$ such that $g_m$ is kept within ±5% of a set value despite changes in temperature.

5. The semiconductor device of claim 4,
wherein the bias voltage generating circuit is configured such that the set value may be variably selected from a plurality of possible values.

6. The semiconductor device of claim 5, further comprising:
a second sample-and-hold circuit and a second error correction circuit connected to the second sample-and-hold circuit, and
a calibration pulse generating circuit that injects an artificial error into the sample-and-hold circuit during the error correction operation, and
a calibration circuit that performs a calibration operation comprising iteratively integrating a difference between an output $V_{out(A)}$ of the sample and hold circuit and an output $V_{out(B)}$ of the second sample and hold circuit and generating a control signal that controls the set value of the bias voltage generating circuit, until $|V_{out(A)}-V_{out(B)}|\le \epsilon$, where $\epsilon$ is a predetermined threshold value.

7. The semiconductor device of claim 2, further comprising:
a second sample-and-hold circuit and a second error correction circuit connected to the second sample-and-hold circuit, and
a calibration pulse generating circuit that injects an artificial error into the sample-and-hold circuit during the error correction operation, and
a calibration unit that performs a calibration operation comprising iteratively integrating a difference between an output $V_{out(A)}$ of the sample and hold circuit and an output $V_{out(B)}$ of the second sample and hold circuit and generating a control signal that controls $g_m$, until $|V_{out(A)}-V_{out(B)}|\le \epsilon$, where $\epsilon$ is a predetermined threshold value.

8. The semiconductor device of claim 2,
wherein at least one of the error-current-accumulating capacitor and a capacitor included in the feedback circuit is a variable-capacitance capacitor.

9. The semiconductor device of claim 8, further comprising:
a second sample-and-hold circuit and a second error correction circuit connected to the second sample-and-hold circuit, and
a calibration pulse generating circuit that injects an artificial error into the sample-and-hold circuit during the error correction operation, and
a calibration unit that performs a calibration operation comprising iteratively integrating a difference between an output $V_{out(A)}$ of the sample and hold circuit and an output $V_{out(B)}$ of the second sample and hold circuit and generating a control signal that controls the capacitance of the variable capacitance capacitor, until $|V_{out(A)}-V_{out(B)}|\le \epsilon$, where $\epsilon$ is a predetermined threshold value.

10. The semiconductor device of claim 1,
wherein the sample-and-hold circuit comprises a sampling capacitor with a first electrode connected to an input signal line and a second electrode connected to a first input of the amplifier, and the sample-and-hold circuit is configured to perform a sampling operation comprising:
applying an input signal to the first electrode of the sampling capacitor and applying a reference voltage to a second input of the amplifier,
connecting the second electrode of the sampling capacitor to an output of the amplifier;
disconnecting the second electrode of the sampling capacitor from the output of the amplifier, and
connecting the first electrode of the sampling capacitor to the output of the amplifier, and
the error correction circuit is configured to perform the error correction operation after the second electrode of the sampling capacitor is disconnected from the output of the amplifier and before the first electrode of the sampling capacitor is connected to the output of the amplifier.

11. The semiconductor device of claim 10,
wherein the feedback circuit comprises a feedback capacitor connected to the first input of the amplifier,
the error correction circuit includes a switch between the error-current-accumulating capacitor and the feedback circuit,
the switch is open during the accumulating, at the error-current-accumulating capacitor, of the error current output, and
the voltage boost is applied to the first input of the amplifier by closing the switch.

12. An electronic device, comprising:
the semiconductor device of claim 1.

13. An image sensor, comprising:
a pixel array comprising pixels that convert incident light into a pixel signal;
at least one signal line connected to at least one of the pixels and receiving the pixel signal thereof; and
the semiconductor device of claim 1 connected to the at least one signal line and configured to sample the pixel signal carried thereon.

14. A method of operating a semiconductor device comprising a sample-and-hold circuit having an error correction circuit portion comprising an error-current-accumulating capacitor and a feedback circuit, the method comprising:
causing the error-current-accumulating capacitor to accumulate an error current that is output from an amplifier of the sample-and-hold circuit, and
causing the feedback circuit to apply a voltage boost to an input of the amplifier, where the magnitude of the voltage boost depends on a voltage of the error-current-accumulating capacitor.

15. The method of claim 14,
wherein the magnitude of the voltage boost depends on:
an amount of time T that the error current is accumulated at the error-current-accumulating capacitor;
a transconductance $g_m$ of the amplifier;
a capacitance $C_{int}$ of the error-current-accumulating capacitor; and
a voltage gain $\beta$ of the feedback circuit, and
the method further comprises:
controlling at least one of the parameters T, $g_m$, $C_{int}$, and $\beta$ such that $$\frac{\beta g_m T}{C_{int}} \approx 1.$$

16. The method of claim 15, further comprising:
controlling $g_m$ such that $$\frac{\beta g_m T}{C_{int}} \approx 1.$$

17. The method of claim 16, further comprising:
injecting an artificial error into the sample-and-hold circuit and controlling $g_m$ based on a comparison of an output of the sample-and-hold circuit with the injected error to an output of a second sample-and-hold circuit without the injected error.

18. The method of claim 16, further comprising:
controlling $g_m$ by modifying a bias voltage that is supplied to input-stage transistors of an amplifier of the sample-and-hold circuit.

19. The method of claim 14, wherein the sample-and-hold circuit comprises a sampling capacitor with a first electrode connected to an input signal line and a second electrode connected to a first input of the amplifier, and the method further comprises:
- applying an input signal to the first electrode of the sampling capacitor and applying a reference voltage to a second input of the amplifier;
- connecting the second electrode of the sampling capacitor to an output of the amplifier;
- disconnecting the second electrode of the sampling capacitor from the output of the amplifier; and
- connecting the first electrode of the sampling capacitor to the output of the amplifier,
- wherein said causing the error-current-accumulating capacitor to accumulate the error current and said causing the feedback circuit to apply the voltage boost to the input of the amplifier are performed after said disconnecting the second electrode of the sampling capacitor from the output of the amplifier and before said connecting the first electrode of the sampling capacitor to the output of the amplifier.

20. A sample-and-hold device, comprising:
- an amplifier having a first input and a second input, the second input being connected to a reference voltage;
- a sampling capacitor having a first electrode connected to a signal line and a second electrode connected to the first input of the amplifier;
- a first switch in a current path between the first electrode and an output of the amplifier;
- a second switch in a current path between the first electrode and the output of the amplifier;
- an error-current-accumulating capacitor connected to the output of the amplifier;
- a feedback circuit comprising a feedback capacitor that is connected to the first input of the amplifier; and
- a third switch in a current path between the error-current-accumulating capacitor and the feedback circuit,
- wherein the sample-and-hold device is configured to sample an input signal of the signal line by:
  - in a first time period, having the first switch and the third switch closed while the second switch is open;
  - in a second time period, opening the first switch and the third switch and accumulating an error current at the error-current-accumulating capacitor for a predetermined amount of time;
  - in a third time period, closing the third switch and thereby feeding back a voltage boost from the error-current-accumulating capacitor to the first input of the amplifier via the feedback circuit; and
  - in a fourth time period, opening the third switch and closing the second switch.

* * * * *